(12) United States Patent
Ozeki et al.

(10) Patent No.: US 12,181,763 B2
(45) Date of Patent: Dec. 31, 2024

(54) DISPLAY DEVICE

(71) Applicant: Japan Display Inc., Tokyo (JP)

(72) Inventors: Yoshitaka Ozeki, Tokyo (JP); Gen Koide, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/843,130

(22) Filed: Jun. 17, 2022

(65) Prior Publication Data

US 2022/0404655 A1    Dec. 22, 2022

(30) Foreign Application Priority Data

Jun. 22, 2021 (JP) ................................. 2021-103585

(51) Int. Cl.

| | | |
|---|---|---|
| G02F 1/1368 | (2006.01) | |
| G02F 1/1362 | (2006.01) | |
| G09G 3/36 | (2006.01) | |
| H01L 27/12 | (2006.01) | |
| H01L 29/786 | (2006.01) | |

(52) U.S. Cl.
CPC ...... *G02F 1/1368* (2013.01); *G02F 1/136209* (2013.01); *G09G 3/3648* (2013.01); *H01L 27/1225* (2013.01); *H01L 27/124* (2013.01); *H01L 29/78633* (2013.01); *H01L 29/7869* (2013.01); *G09G 2300/0426* (2013.01); *G09G 2300/0842* (2013.01)

(58) Field of Classification Search
CPC .................................................... G02F 1/1368
See application file for complete search history.

(56) References Cited

U.S. PATENT DOCUMENTS

| | | | |
|---|---|---|---|
| 2011/0058116 A1 | 3/2011 | Yamazaki et al. | |
| 2012/0069257 A1* | 3/2012 | Oh | G02F 1/136227 |
| | | | 257/E33.062 |
| 2017/0139294 A1* | 5/2017 | Kim | G09G 3/3648 |
| 2018/0031881 A1* | 2/2018 | Kubota | G02F 1/133555 |

(Continued)

FOREIGN PATENT DOCUMENTS

| | | |
|---|---|---|
| JP | 2014-146819 A | 8/2014 |
| JP | 2015-159315 A | 9/2015 |

OTHER PUBLICATIONS

English translation of Office Action issued in related Chinese Patent Application No. 202210681044.X, mailed on Aug. 1, 2024. 8 pages.

*Primary Examiner* — Sang V Nguyen
(74) *Attorney, Agent, or Firm* — K&L Gates LLP

(57) ABSTRACT

A display device includes: a first transistor provided with an oxide semiconductor layer, a first gate electrode facing the oxide semiconductor layer and a first gate insulating layer between the oxide semiconductor layer and the first gate electrode; a first transparent conductive layer above the first transistor; a second transparent conductive layer above the first transparent conductive layer, the second transparent conductive layer being isolated from the first transparent conductive layer and facing the first transparent conductive layer; and a third transparent conductive layer above the second transparent conductive layer, the third transparent conductive layer being isolated from the second transparent conductive layer, being connected to the first transparent conductive layer and facing the second transparent conductive layer.

17 Claims, 17 Drawing Sheets

(56) References Cited

U.S. PATENT DOCUMENTS

2018/0348584 A1\* 12/2018 Wu ................... G02F 1/133345
2019/0056620 A1\* 2/2019 Akiyoshi .............. H01L 27/124
2021/0109412 A1\* 4/2021 Suzumura ......... G02F 1/136286
2022/0326581 A1\* 10/2022 Kimura ............... G02F 1/13394

\* cited by examiner

DISPLAY DEVICE

CROSS REFERENCE TO RELATED APPLICATIONS

This application claims the benefit of priority to Japanese Patent Application No. 2021-103585, filed on Jun. 22, 2021, the entire contents of which are incorporated herein by reference.

FIELD

One embodiment of the present invention relates to a display device. In particular, one embodiment of the present invention relates to a display device using a transistor having an oxide semiconductor.

BACKGROUND

Recently, a transistor using an oxide semiconductor as a channel has been developed in place of an amorphous silicon, a low-temperature polysilicon, and a single-crystal silicon (e.g., Japanese laid-open patent publication No. 2014-146819 and Japanese laid-open patent publication No. 2015-159315). The transistor using the oxide semiconductor as the channel is formed in a simple-structured, low-temperature process similar to a transistor using an amorphous silicon as a channel. It is known that the transistor using the oxide semiconductor as the channel has higher mobility than the transistor using the amorphous silicon as the channel and has a very low off-current.

In recent years, due to the advancement in the technology for a resolution to be enhanced furthermore of a pixel in modern display devices, it has also become possible to reduce the width of wiring and the size of transistors. However, there is a limitation to these reductions, and an aperture ratio is reduced due to arrangements of a metal layer and a semiconductor layer constituting a pixel circuit. Therefore, the development for using the oxide semiconductor layer as the channel of the transistor in the pixel circuit, which obtains sufficient characteristics in spite of its miniaturized size is progressing.

With the reduction of the pixel size, the area for placing the capacitive element used in the pixel circuit is limited. Therefore, there was a problem that it was difficult to form a capacitive element having a sufficient size to drive the pixel circuit. Because of that influence, there was a problem that a holding characteristic of the charge in the pixel circuit was lowered and a display operation in the display device became unstable.

SUMMARY

A display device according to an embodiment of the present disclosure includes: a first transistor provided with an oxide semiconductor layer, a first gate electrode facing the oxide semiconductor layer and a first gate insulating layer between the oxide semiconductor layer and the first gate electrode; a first transparent conductive layer above the first transistor; a second transparent conductive layer above the first transparent conductive layer, the second transparent conductive layer being isolated from the first transparent conductive layer and facing the first transparent conductive layer; and a third transparent conductive layer above the second transparent conductive layer, the third transparent conductive layer being isolated from the second transparent conductive layer, being connected to the first transparent conductive layer and facing the second transparent conductive layer.

A display device according to an embodiment of the present disclosure includes: a first transistor provided with an oxide semiconductor layer, a first gate electrode facing the oxide semiconductor layer and a first gate insulating layer between the oxide semiconductor layer and the first gate electrode; a first transparent conductive layer above the first transistor; a second transparent conductive layer above the first transparent conductive layer, the second transparent conductive layer being isolated from the first transparent conductive layer and overlapping the first transparent conductive layer in a translucent area of pixel; and a third transparent conductive layer above the second transparent conductive layer, the third transparent conductive layer being isolated from the second transparent conductive layer, being connected to the first transparent conductive layer and overlapping the second transparent conductive layer in the translucent area.

DESCRIPTION OF EMBODIMENTS

Figure 1:
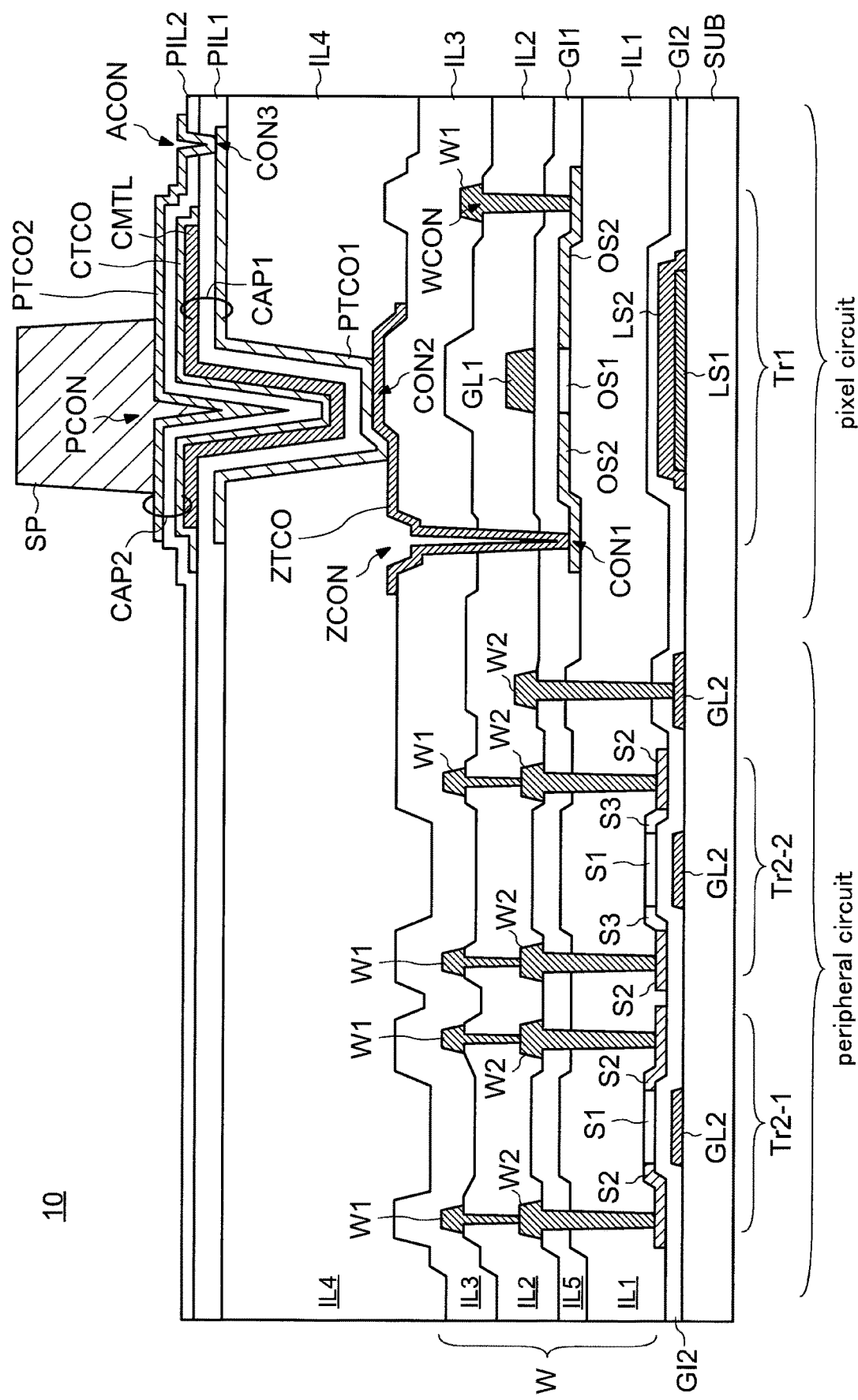
FIG. 1 is a cross-sectional view showing an outline of a display device according to an embodiment of the present invention.

Embodiments of the present invention will be described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the embodiments of the present invention, a direction from a substrate to an oxide semiconductor layer is referred to as upper or above. On the contrary, a direction from the oxide semiconductor layer to the substrate is referred to as lower or below. As described above, for convenience of explanation, although the phrase "above" or "below" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Above or below means a stacking order in a structure in which multiple layers are stacked, when it is expressed as a pixel electrode above a transistor, it may be a positional relationship where the transistor and the pixel electrode do not overlap each other in a plan view. On the other hand, when it is expressed as a pixel electrode vertically above a transistor, it means a positional relationship where the transistor and the pixel electrode overlap each other in a plan view.

"Display device" refers to a structure configured to display an image using electro-optic layers. For example, the term display device may refer to a display panel including the electro-optic layer, or it may refer to a structure in which other optical members (e.g., polarizing member, backlight, touch panel, etc.) are attached to a display cell. The "electro-optic layer" can include a liquid crystal layer, an electroluminescence (EL) layer, an electrochromic (EC) layer, and an electrophoretic layer, as long as there is no technical contradiction. Therefore, although the embodiments described later will be described by exemplifying the liquid crystal display device including a liquid crystal layer as the display device, the structure in the present embodiment can be applied to a display device including the other electro-optical layers described above.

The expressions "α includes A, B, or C", "a includes any of A, B, and C", and "α includes one selected from a group consisting of A, B, and C" do not exclude the case where α includes multiple combinations of A to C unless otherwise specified. Furthermore, these expressions do not exclude the case where α includes other elements.

The following embodiments may be combined with each other as long as there is no technical contradiction.

It is an object of one embodiment of the present disclosure to realize a stable display operation of the display device.

1. First Embodiment

[1-1. Configuration of Display Device 10]

Figure 2:
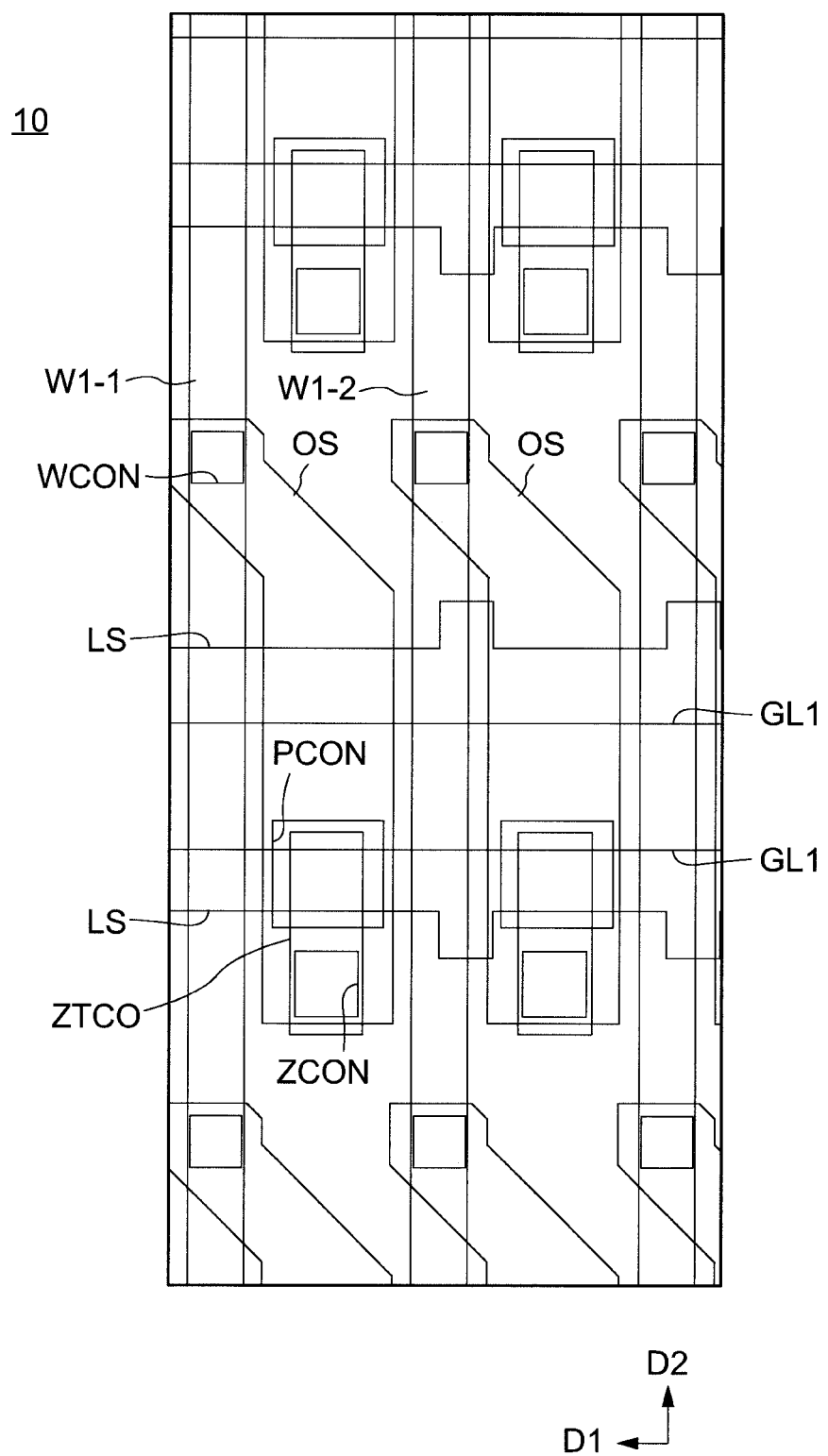
FIG. 2 is a plan view showing an outline of a display device according to an embodiment of the present invention.

A configuration of a display device 10 according to an embodiment of the present invention will be described with reference to FIG. 1 to FIG. 13. FIG. 1 is a cross-sectional view showing an outline of a display device according to an embodiment of the present invention. FIG. 2 is a plan view showing an outline of a display device according to an embodiment of the present invention. FIG. 3 to FIG. 13 are plan views illustrating layouts of each layer in a display device according to an embodiment of the present invention. The cross-sectional view in FIG. 1 is for explaining a layer structure of the display device 10, which may not exactly match the plan view in FIG. 2.

As shown in FIG. 1, the display device 10 is provided above the substrate SUB. The display device 10 includes a transistor Tr1, transistors Tr2 (Tr2-1, Tr2-2), wirings W (W1, W2), a connecting electrode ZTCO, a pixel electrode PTCO1, a common auxiliary electrode CMTL, a common electrode CTCO, and a pixel electrode PTCO2. The "TCO" is an abbreviation for Transparent Conductive Oxide. The transistor Tr1 is a transistor included in the pixel circuitry of the display device 10 (e.g., a selection transistor). The transistor Tr2 is a transistor included in the peripheral circuit. Although details will be described later, the peripheral circuit is a drive circuit for driving the pixel circuit.

[1-2. Configuration of Transistor Tr1]

The transistor Tr1 includes an oxide semiconductor layer OS (OS1, OS2), a gate insulating layer GI1, and a gate electrode GL1. The gate electrode GL1 faces the oxide semiconductor layer OS. The gate insulating layer GI1 is provided between the oxide semiconductor layer OS and the gate electrode GL1. In the present embodiment, although a top gate type transistor in which the oxide semiconductor layer OS is provided closer to the substrate SUB with respect to the gate electrode GL1 is exemplified in a pixel circuit provided in a display area, a bottom gate type transistor in which a positional relationship between the gate electrode GL1 and the oxide semiconductor layer OS is reversed may be applied. The gate insulating layer GI1 may be referred to as a "first gate insulating layer". The gate electrode GL1 may be referred to as a "first gate electrode".

The oxide semiconductor layer OS includes oxide semiconductor layers OS1, OS2. The oxide semiconductor layer OS1 is an oxide semiconductor layer in an area overlapping the gate electrode GL1 in a plan view. The oxide semiconductor layer OS1 functions as a semiconductor layer and is switched between a conductive state and a non-conductive state according to a voltage supplied to the gate electrode GL1. That is, the oxide semiconductor layer OS1 functions as a channel for the transistor Tr1. The oxide semiconductor layer OS2 functions as a conductive layer. The oxide semiconductor layers OS1, OS2 are layers formed from the same oxide semiconductor layer. For example, the oxide semiconductor layer OS2 is a low resistance oxide semiconductor layer formed by doping impurities into a layer which has the same physical properties as the oxide semiconductor layer OS1.

An insulating layer IL2 is provided above the gate electrode GL1. A wiring W1 is provided above the insulating layer IL2. The wiring W1 is connected to the oxide semiconductor layer OS2 via an opening WCON provided in the insulating layer IL2 and the gate insulating layer GI1. A data signal related to pixel gradation is transmitted to the wiring W1 connected to the oxide semiconductor layer OS2. An insulating layer IL3 is provided above the insulating layer IL2 and the wiring W1.

The connecting electrode ZTCO is provided above the insulating layer IL3. The connecting electrode ZTCO is connected to the oxide semiconductor layered OS2 via an opening ZCON provided in the insulating layers IL3, IL2, and the gate insulating layer GI1. The connecting electrode ZTCO is in contact with the oxide semiconductor layer OS2 at the bottom of the opening ZCON. The connecting electrode ZTCO is a transparent conductive layer.

An area where the connecting electrode ZTCO and the oxide semiconductor layer OS2 are in contact with each other is referred to as a first contact area CON1. The connecting electrode ZTCO may be referred to as a "fourth transparent conductive layer". Although details will be described later, in a plan view, the connecting electrode ZTCO has a portion (a first portion PT1) overlapping the gate electrode GL1 and the oxide semiconductor layer OS1 and a portion (a second portion PT2) in contact with the oxide semiconductor layer OS2 in the first contact area CON1 that does not overlap the gate electrode GL1 and wiring W1 (see FIG. 9). In a plan view, the first contact area CON1 is included in the display area (translucent area) of the pixel.

As mentioned above, the connecting electrode ZTCO and the oxide semiconductor layer OS2 are directly in contact with each other. For example, when a transparent conductive layer such as an ITO layer is formed in contact with a semiconductor layer such as a silicon layer, a surface of the semiconductor layer is oxidized by a process gas or oxygen ions at the time of a deposition of an ITO film. Since an oxide layer formed on the surface of the semiconductor layer is high resistance, a contact resistance between the semiconductor layer and the transparent conductive layer is increased. As a result, there is a defect in an electrical contact between the semiconductor layer and the transparent conductive layer. On the other hand, even if the above transparent conductive layer is formed so as to be in contact with the oxide semiconductor layer, a high resistance oxide layer as described above is not formed on a surface of the oxide semiconductor layer. Therefore, there is no defect in the electrical contact between the oxide semiconductor layer and the transparent conductive layer.

An insulating layer IL4 is provided above the connecting electrode ZTCO. A step is formed by a structure provided in the lower layer than the insulating layer IL4. The insulating-layer IL4 relieves the step. The insulating layer IL4 may be referred to as a planarizing film. The pixel electrode PTCO1 is provided above the insulating layer IL4. That is, the pixel electrode PTCO1 is provided above the transistor Tr1. An opening PCON is provided above the insulating layer IL4. The pixel electrode PTCO1 is connected to the connecting electrode ZTCO via the opening PCON. An area where the connecting electrode ZTCO and the pixel electrode PTCO1 are in contact is referred to as a second contact area CON2. The second contact area CON2 in a plan view overlaps the gate electrode GL1 (see FIG. 10). More specifically, in a plan view, the second contact area CON2 overlaps a pattern end of the gate electrode GL1. The pixel electrode PTCO1 is a transparent conductive layer. In other words, the pixel electrode PTCO1 is connected to the transistor Tr1 via the connecting electrode ZTCO. The pixel electrode PTCO1 may be referred to as a "first transparent conductive layer".

An insulating layer PIL1 is provided above the pixel electrode PTCO1. The common auxiliary electrode CMTL and the common electrode CTCO are provided above the insulating layer PIL1. The common electrode CTCO is insulated from the pixel electrode PTCO1 and faces the pixel electrode PTCO1. The common electrode CTCO is provided in common to a plurality of pixels. In the present embodiment, the common electrodes CTCO are provided in common to the pixels arranged in the row direction, as will be described in detail later (see FIG. 13). The common electrode CTCO may be referred to as a "second transparent conductive layer". Although details will be described later, the common auxiliary electrode CMTL and the common electrode CTCO have different plane patterns (see FIGS. 12 and 13).

The common auxiliary electrodes CMTL are metallic layers. The common electrode CTCO is a transparent conductive layer. An electrical resistance of the common auxiliary electrode CMTL is smaller than an electrical resistance of the common electrode CTCO. The common auxiliary electrodes CMTL also function as light-shielding layers. In other words, the light-shielding layers (the common auxiliary electrodes CMTL) are provided above the transistors Tr1 so as to define respective areas of the plurality of pixels. The light-shielding layer suppresses color mixing by shielding light from adjacent pixels. The common auxiliary electrode CMTL has the same function as the common auxiliary electrode CTCO. Therefore, the common auxiliary electrodes CMTL and the common electrode CTCO may be collectively referred to as a "common electrode".

An insulating layer PIL2 is provided above the common electrode CTCO. The pixel electrode PTCO2 is provided above the insulating layer PIL2. The pixel electrode PTCO2 is insulated from the common electrode CTCO and faces the common electrode CTCO. The pixel electrode PTCO2 is connected to the pixel electrode PTCO1 through an opening ACON provided in the insulating layer PIL1, PIL2. The pixel electrode PTCO2 may be referred to as a "third transparent conductive layer". An area where the pixel electrode PTCO2 and the pixel electrode PTCO1 are in contact is referred to as a third contact area CON3. In a plan view, the third contact area CON3 does not overlap the common auxiliary electrode CMTL (see FIG. 12). That is, the pixel electrode PTCO2 is in contact with the pixel electrode PTCO1 in the translucent area of the pixel.

As described above, a first capacitive element CAP1 is provided. The first capacitive element CAP1 includes the insulating layer PIL1 as a dielectric between the pixel electrode PTCO1 and the common electrode (the common electrode CTCO and the common auxiliary electrode CMTL) opposing each other. A second capacitive element CAP2 is provided. The second capacitive element CAP2 includes the insulating layer PIL2 as a dielectric between the pixel electrode PTCO2 and the common electrode (the common electrode CTCO and the common auxiliary electrode CMTL) opposing each other. The first capacitive element CAP1 and the second capacitive element CAP2 are stacked. Although details will be described later, the first capacitive element CAP1 and the second capacitive element CAP2 overlap in a plan view (see FIG. 14). These capacitive elements function as a holding capacitor in the pixel circuit.

A spacer SP is provided on the pixel electrode PTCO2. The spacer SP is provided for a part of the pixels. For example, the spacer SP may be provided for any one of a blue pixel, a red pixel and a green pixel. However, the spacer SP may be provided for all the pixels. A height of the spacer SP is half the height of a cell gap. A spacer is also provided on a counter substrate, and the spacer on the counter substrate and the above spacer SP overlap in a plan view.

A light-shielding layer LS is provided between the transistor Tr1 and the substrate SUB. In the present embodiment, light-shielding layers LS1, LS2 are provided as the light-shielding layer LS. However, the light-shielding layer LS may be formed of only the light-shielding layer LS1 or LS2. In a plan view, the light-shielding layer LS is provided in an area where the gate electrode GL1 and the oxide semiconductor layer OS overlap. That is, in a plan view, the light-shielding layer LS is provided in an area overlapping the oxide semiconductor layer OS1 (see FIG. 5). The light-shielding layer LS suppresses the light incident from the substrate SUB side from reaching the oxide semiconductor layer OS1. In the case where a conductive layer is used as the light-shielding layer LS, a voltage may be applied to the light-shielding layer LS to control the oxide semiconductor layer OS1. In the case where a voltage is applied to the light-shielding layer LS, the light-shielding layer LS and the gate electrode GL1 may be connected by a peripheral area of the pixel circuit. In a plan view, the above first contact area CON1 is provided in an area not overlapping the light-shielding layer LS (see FIG. 2).

[1-3. Configuration of transistor Tr2]

The transistor Tr2 has a p-type transistor Tr2-1 and an n-type transistor Tr2-2. The transistor Tr2 may be referred to as a "second transistor".

The p-type transistor Tr2-1 and the n-type transistor Tr2-2 both include a gate electrode GL2, a gate insulating layer GI2, and a semiconductor layer S (S1 and S2, or S1, S2 and S3). The gate electrode GL2 faces the semiconductor layer S. The gate insulating layer GI2 is provided between the semiconductor layer S and the gate electrode GL2. In the present embodiment, although a bottom gate type transistor in which the gate electrode GL2 is provided closer to the substrate SUB than the semiconductor layer S is exemplified as the transistor Tr2 used in these peripheral circuit, a top gate type transistor in which a positional relationship between the semiconductor layer S and the gate electrode GL2 is reversed may be used as the display device. The gate electrode GL2 may be referred to as a "second gate electrode". The gate insulating layer GI2 may be referred to as a "second gate insulating layer".

The semiconductor layer S of the p-type transistor Tr2-1 includes semiconductor layers S1 and S2. The semiconductor layer S of the n-type transistor Tr2-2 includes the semiconductor layers S1, S2 and S3. The semiconductor layer S1 is a semiconductor layer overlapping the gate electrode GL2 in a plan view. The semiconductor layer S1 functions as a channel for the transistors Tr2-1 and Tr2-2. The semiconductor layer S2 functions as a conductive layer. The semiconductor layer S3 functions as a conductive layer with a higher resistance than the semiconductor layer S2. The semiconductor layer S3 suppresses hot carrier degradation by attenuating hot carriers intruding toward the semiconductor layer S1.

An insulating layer IL1 and an insulating layer IL5 are provided above the semiconductor layer S. The insulating layer IL5 is the same layer as the gate insulating layer GI1 of the transistor Tr1. That is, the insulating layer IL5 is continuous without passing an interface with the gate insulating layer GI1. The wiring W2 is provided above the insulating layer IL5. The wiring W2 is connected to the semiconductor layer S2 through an opening provided in the insulating layer IL1 and the insulating layer IL5. The insulating layer IL2 is provided above the wiring W2. The wiring W1 is provided above the insulating layer IL2. The wiring W1 is connected to the wiring W2 through an opening provided in the insulating layer IL2. The insulating layer IL5 may be referred to as a "first insulating layer".

The gate electrode GL2 and the light-shielding layer LS2 are the same layer. The wiring W2 and the gate electrode GL1 are the same layer. The same layer means that a plurality of members provided at different positions above the substrate are members formed by the same process. Therefore, a plurality of members expressed as the same layer are made of the same material and are in contact with a common layer. The same material means that the plurality of members are formed of the same single material. Alternatively, in the case where the plurality of members are formed by stacking a plurality of layers, it means that the materials of the plurality of layers are the same, and the stacked structure of the plurality of layers is also the same.

In FIG. 1, the gate electrode GL2 and the light-shielding layer LS2 are in contact with the gate insulating layer GI2. The wiring W2 and the gate electrode GL1 are in contact with the gate insulating layer GI1 and the insulating layer IL5. In other words, the gate electrode GL2 and the light-shielding layer LS2 are in contact with successive layers or members without passing through the interface. Similarly, the wiring W2 and the gate electrode GL1 are in contact with successive layers or members without passing through the interface.

[1-4. Plane Layout of Display Device 10]

A plane layout of a pixel of the display device 10 will be described with reference to FIG. 2 to FIG. 14. In FIG. 2, the pixel electrode PTCO1, PTCO2, the common auxiliary electrode CMTL, the common electrode CTCO, and the spacer SP are omitted. These plane layout of the pixel electrode PTCO, the common auxiliary electrode CMTL, and the common electrode CTCO are shown in FIG. 11 to FIG. 14, respectively.

Figure 3:
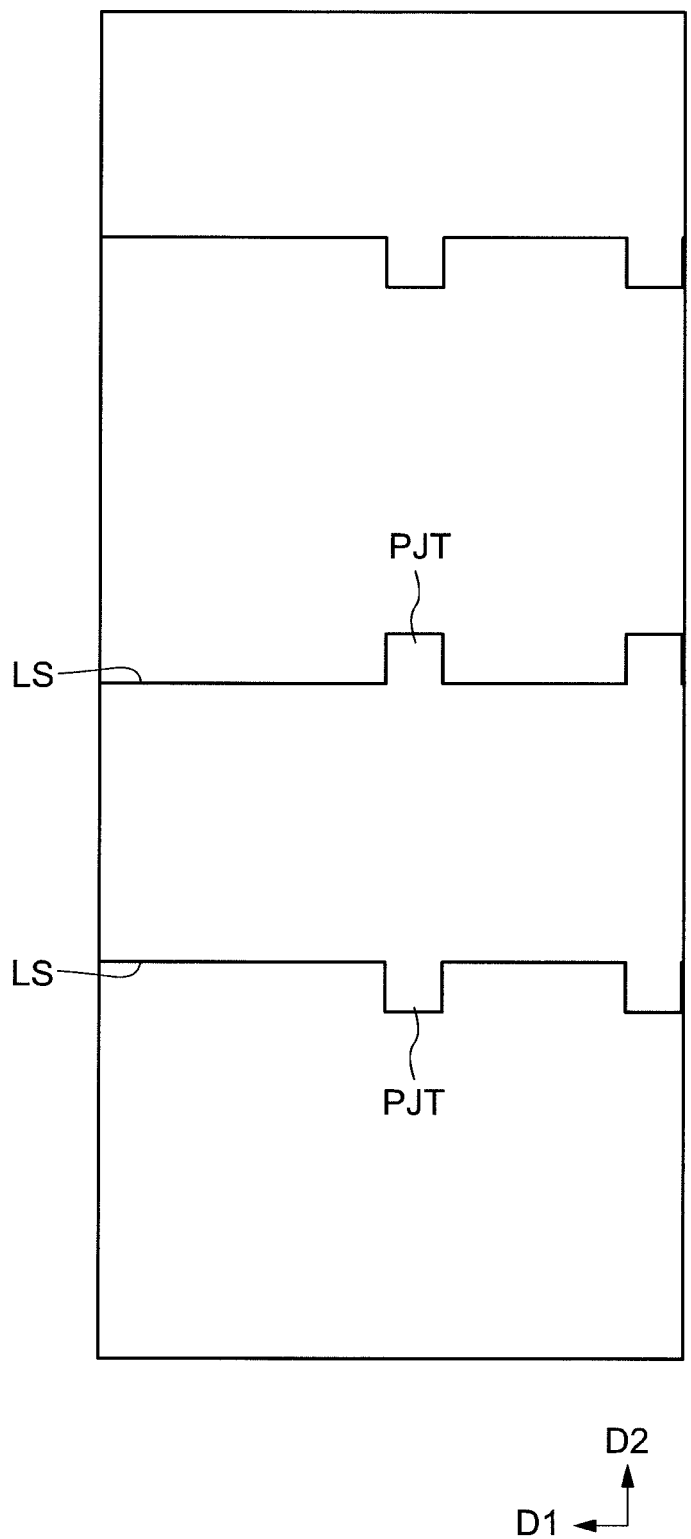
FIG. 3 is a plan view illustrating a layout of each layer in a display device according to an embodiment of the present invention.
Figure 5:
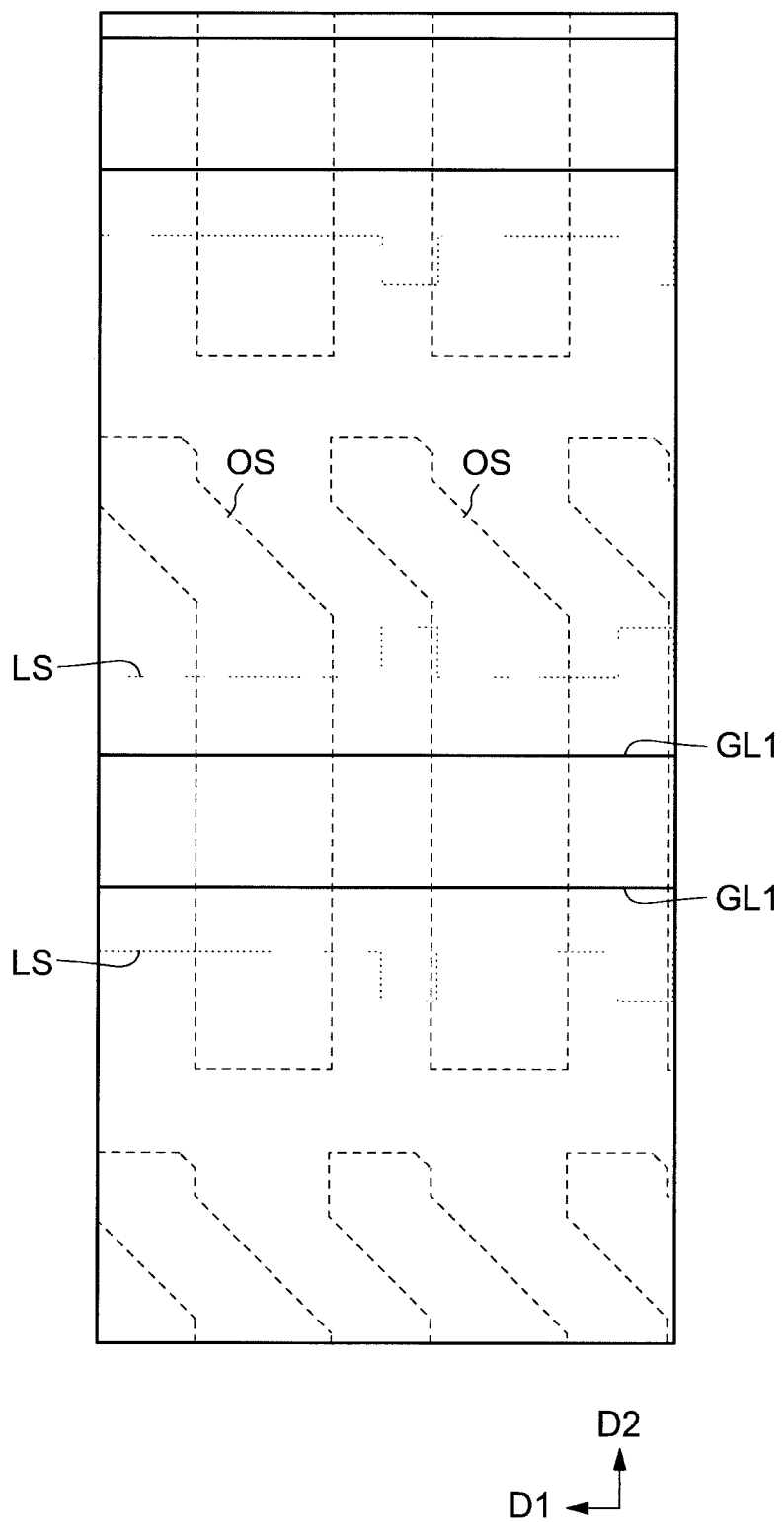
FIG. 5 is a plan view illustrating a layout of one or more layers in a display device according to an embodiment of the present invention.

As shown in FIG. 2 and FIG. 3, the light-shielding layer LS extends in a direction D1. A shape of the light-shielding layer LS may be different depending on the pixel. In the present embodiment, a protruding part PJT protruding in a direction D2 is provided from a part of the light-shielding layer LS extending in the direction D1. As shown in FIG. 5, the light-shielding layer LS is provided in an area including the area where the gate electrode GL1 and the oxide semiconductor layer OS overlap in a plan view. The gate electrode GL1 can also be referred to as a "gate line".

Figure 4:
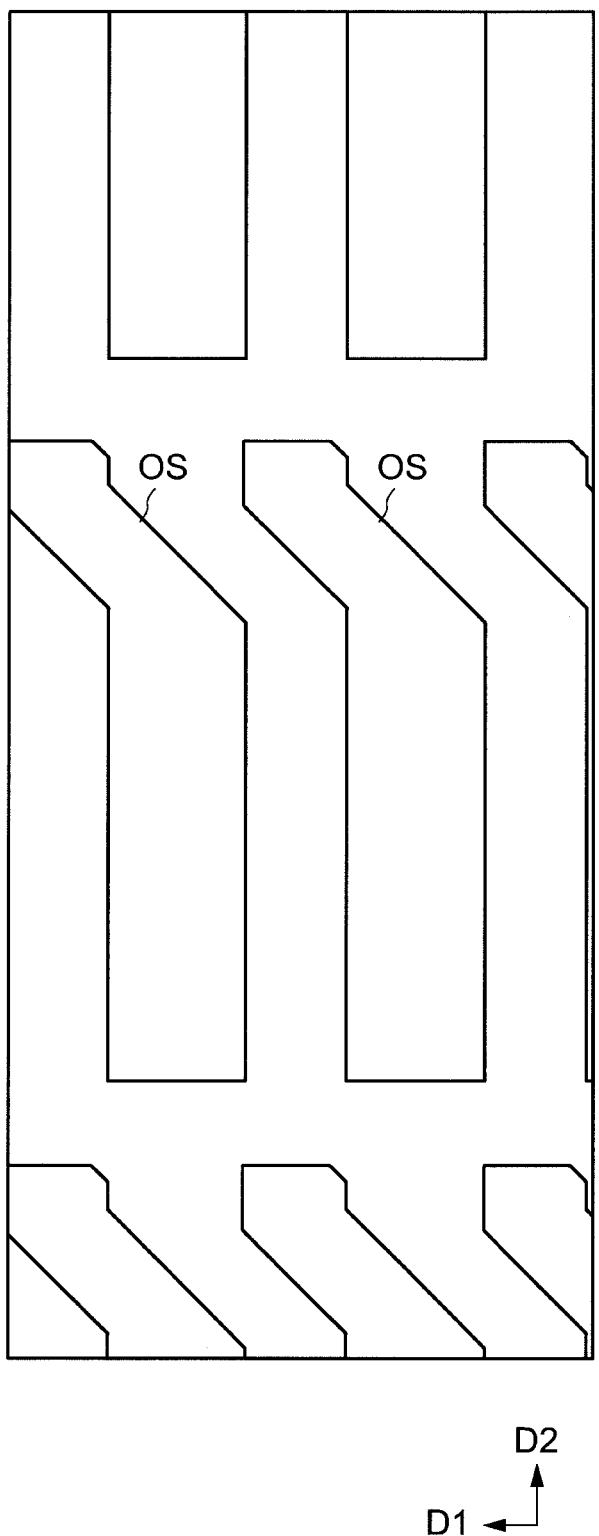
FIG. 4 is a plan view illustrating a layout of one or more layers in a display device according to an embodiment of the present invention.

As shown in FIG. 2, FIG. 4, and FIG. 5, the oxide semiconductor layer OS extends in the direction D2. The gate electrode GL1 extends in the direction D1 so as to intersect the oxide semiconductor layer OS. A pattern of the gate electrode GL1 is provided inside a pattern of the light-shielding layer LS. In other words, the oxide semiconductor layers OS is formed in a long shape intersecting the gate electrode GL1.

Figure 6:
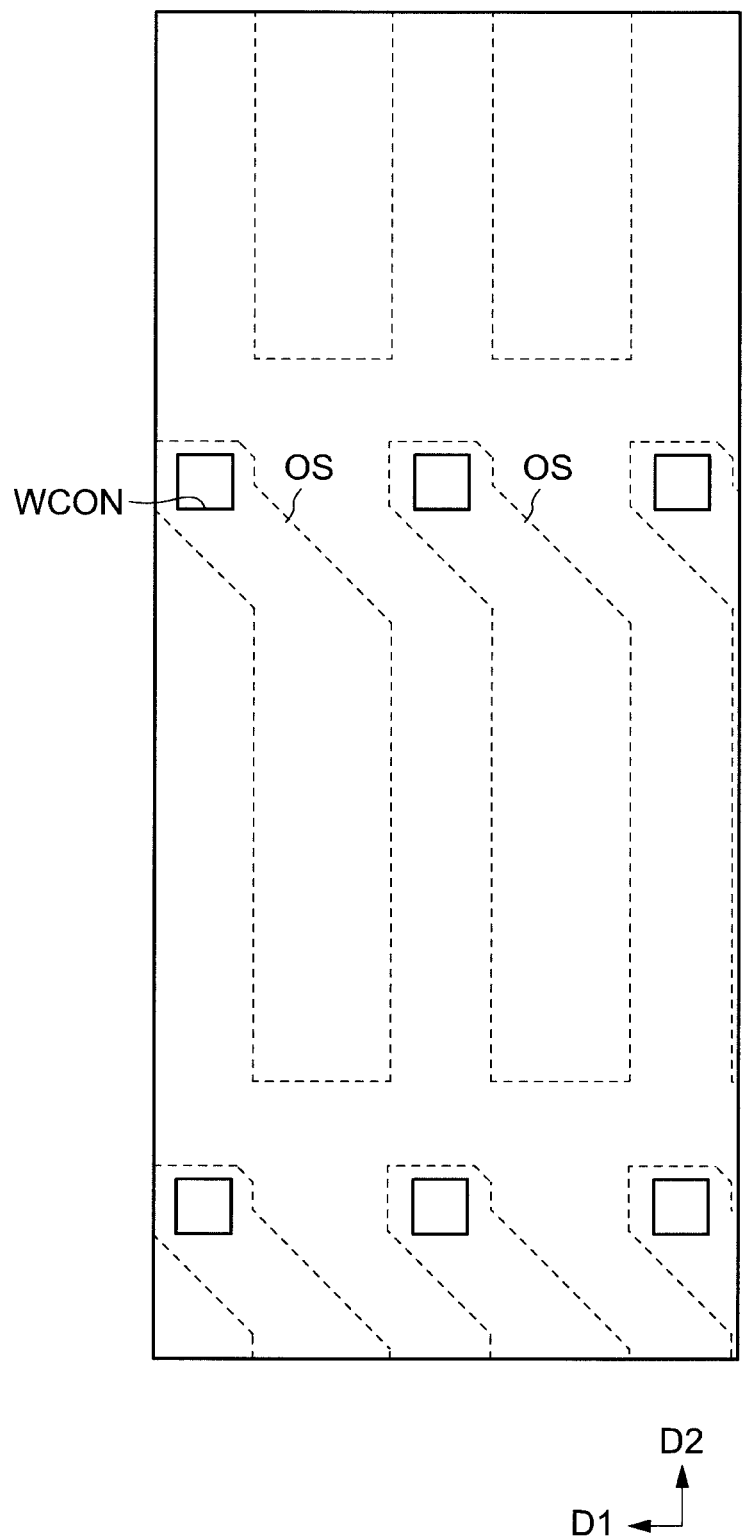
FIG. 6 is a plan view illustrating a layout of one or more layers in a display device according to an embodiment of the present invention.
Figure 7:
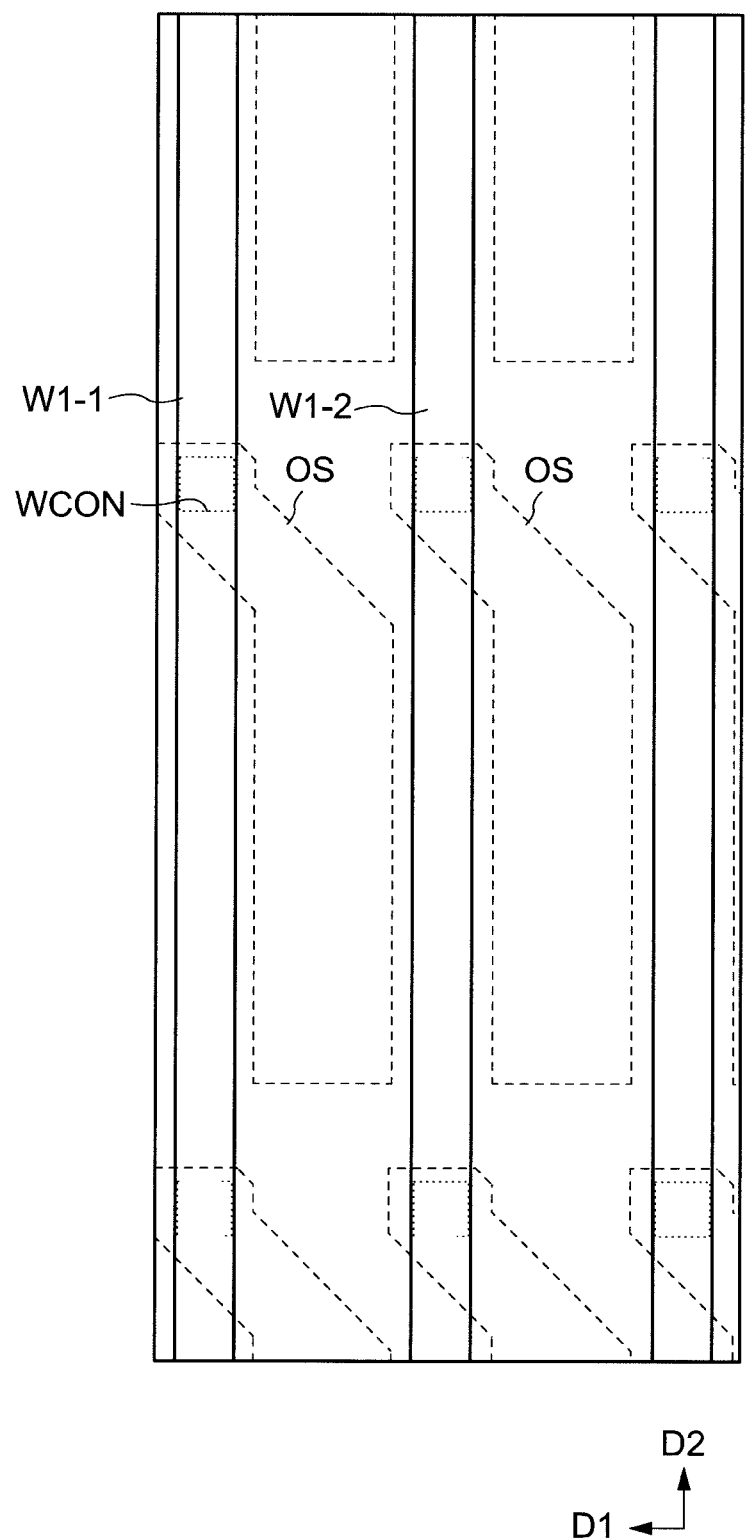
FIG. 7 is a plan view illustrating a layout of one or more layers in a display device according to an embodiment of the present invention.

As shown in FIG. 2, FIG. 6, and FIG. 7, the opening WCON is provided in an area overlapping the wiring W1 (W1-1, W1-2) near an upper end of the pattern of the oxide semiconductor layer OS. A main part of the pattern of the oxide semiconductor layer OS extends in the direction D2 between a pair of the adjacent wirings W1 (between the W1-1 and the W1-2). The remaining part of the pattern of the oxide semiconductor layer OS extends obliquely in the direction D1 and the direction D2 from the main part and overlaps the opening WCON.

As shown in FIG. 2 and FIG. 7, multiple wirings W1 extend in the direction D2. In the case where the adjacent wirings W1 need to be described separately, the adjacent wiring W1 is referred to as a wiring W1-1 (first wiring) and a wiring W1-2 (second wiring). In this case, it can be said that the main part of the oxide semiconductor layer OS extends in the direction D2 between the first wiring W1-1 and the second wiring W1-2, and intersects the gate electrode GL1. In other words, the oxide semiconductor layer OS is provided in a long shape in the direction D2 (shape having a longitudinal) and connected to the wiring W1-1 (the first wiring) at one end in a longitudinal direction of the oxide semiconductor layer OS.

Figure 8:
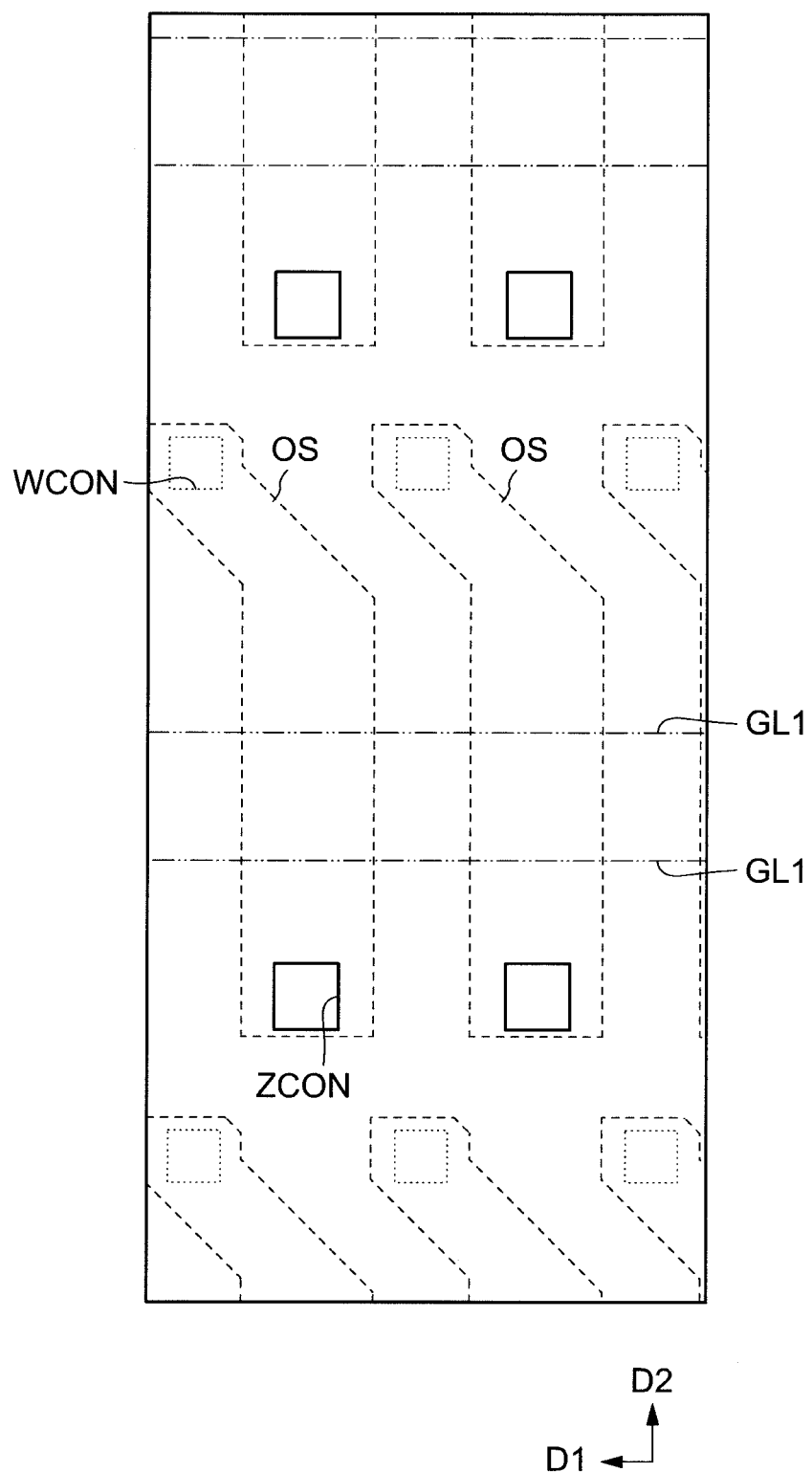
FIG. 8 is a plan view illustrating a layout of one or more layers in a display device according to an embodiment of the present invention.
Figure 9:
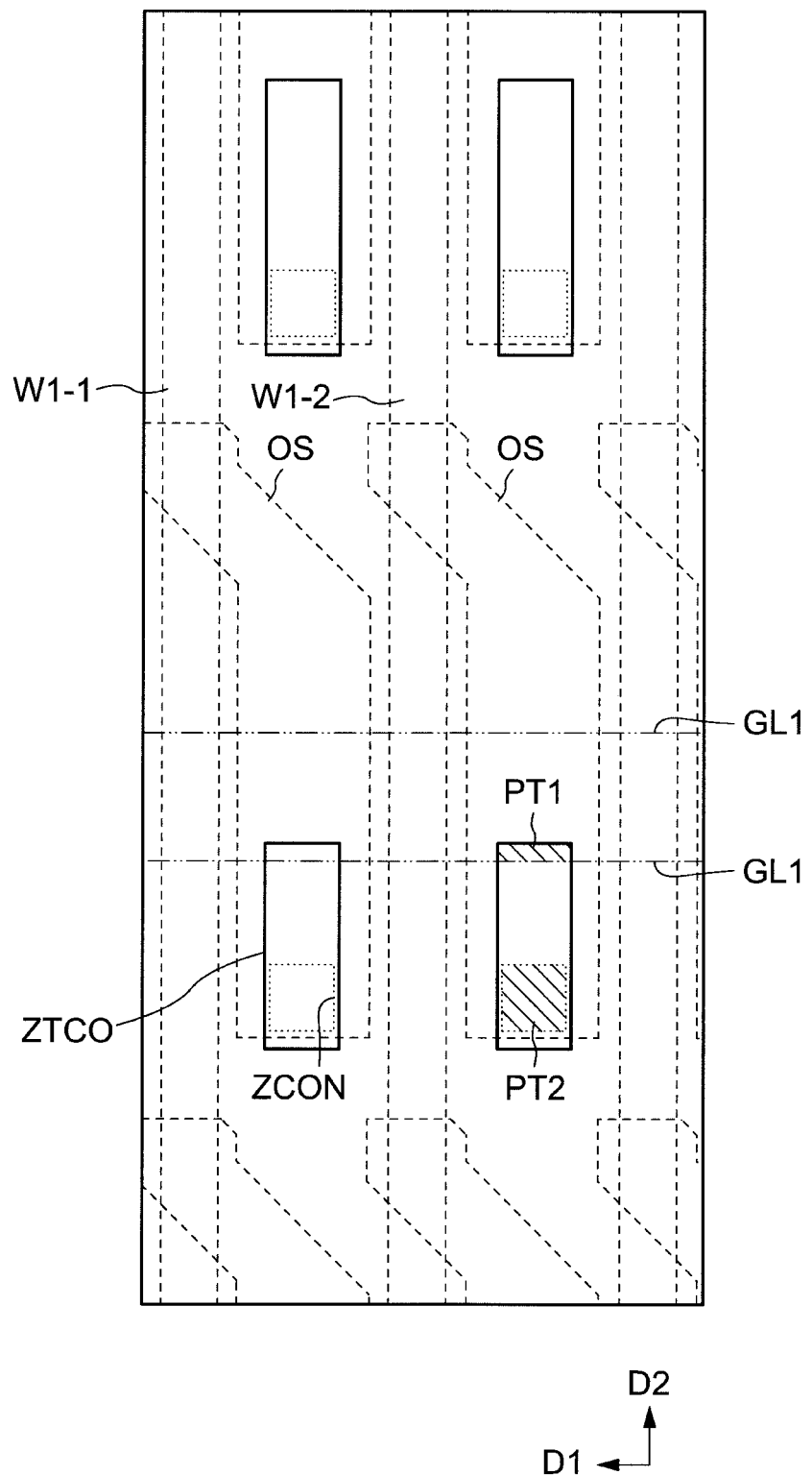
FIG. 9 is a plan view illustrating a layout of one or more layers in a display device according to an embodiment of the present invention.

As shown in FIG. 2, FIG. 8, and FIG. 9, the opening ZCON is provided near a lower end of the pattern of the oxide semiconductor layer OS. The opening ZCON is provided in an area overlapping the pattern of the oxide semiconductor layer OS and not overlapping the gate electrode GL1. The opening ZCON is provided in an area overlapping the connecting electrode ZTCO. The first part PT1 of the connecting electrode ZTCO overlaps the gate electrode GL1 and the oxide semiconductor layer OS between the first wiring W1-1 and the second wiring W1-2. Therefore, the second part PT2 of the connecting electrode ZTCO is in contact with the oxide semiconductor layer OS in the opening ZCON (the first contact area CON1) not overlapping the gate electrode GL1 and wiring W1.

In other words, the oxide semiconductor layer OS is connected to the connecting electrode ZTCO at the other end in the longitudinal direction of the oxide semiconductor layer OS. The connecting electrode ZTCO is formed in a long shape extending in the direction D2 similar to the oxide semiconductor layer OS. In the direction D1, a width of the connecting electrode ZTCO is smaller than a width of the oxide semiconductor layer OS.

As shown in FIG. 2, FIG. 7, and FIG. 8, the oxide semiconductor layer OS is in contact with the wiring W1 at the opposite side of the opening ZCON with respect to the gate electrode GL1. The opening ZCON does not overlap with the light-shielding layer LS.

Figure 10:
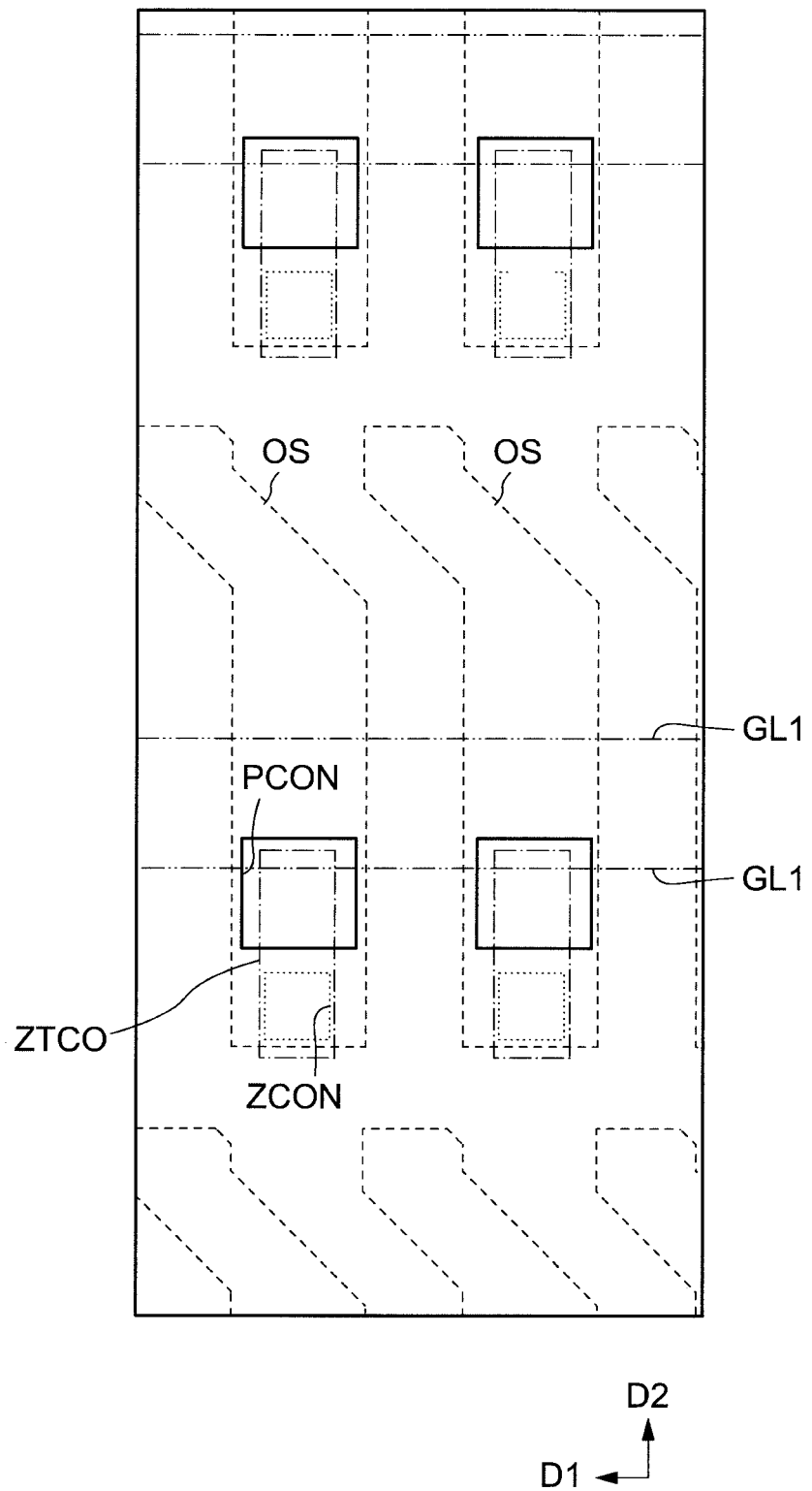
FIG. 10 is a plan view illustrating a layout of one or more layers in a display device according to an embodiment of the present invention.
Figure 11:
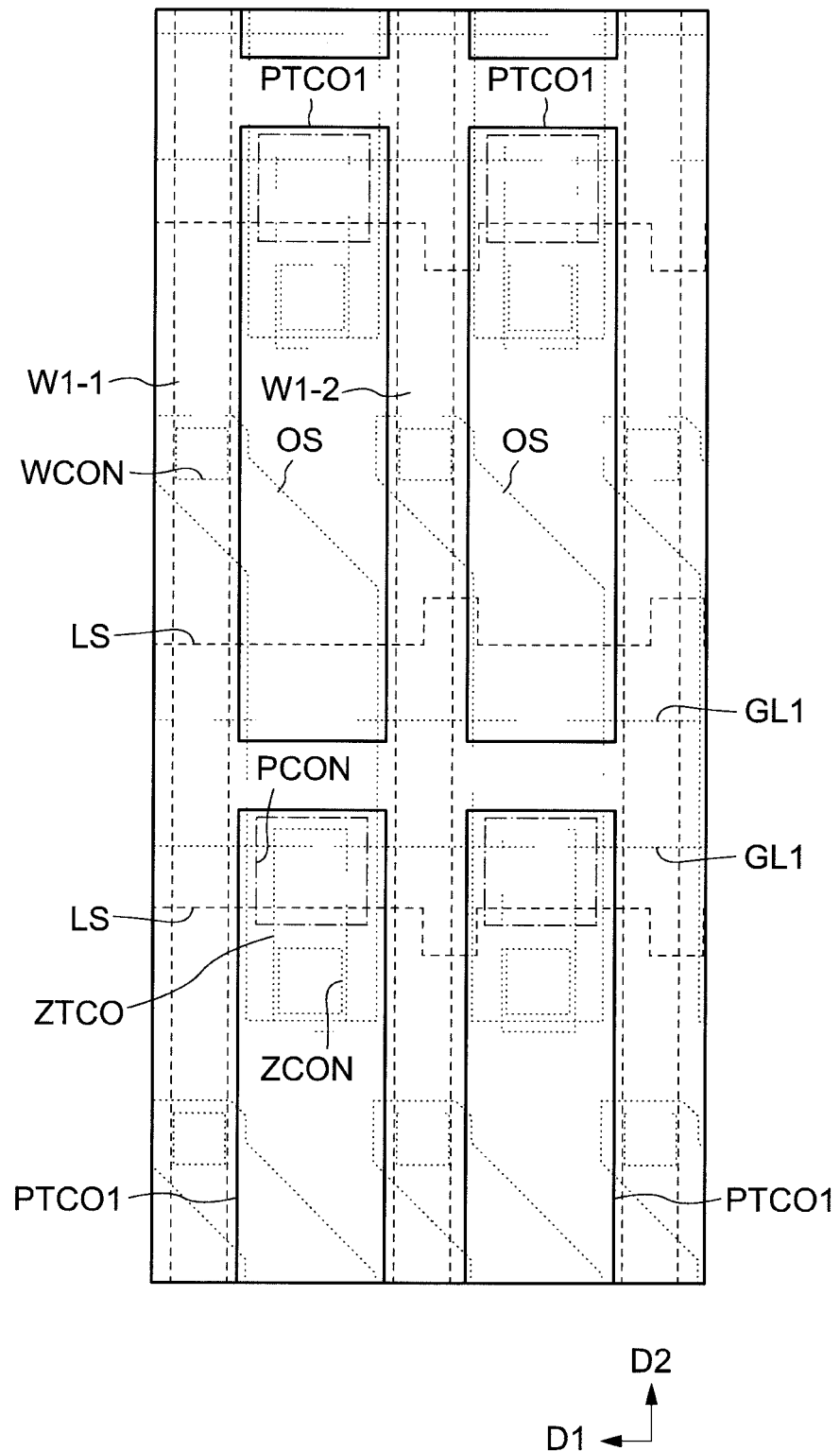
FIG. 11 is a plan view illustrating a layout of one or more layers in a display device according to an embodiment of the present invention.

As shown in FIGS. 2, 10, and 11, the opening PCON is provided in the vicinity of the upper end of the pattern of the connecting electrode ZTCO. The opening PCON is provided in an area including an end of the pattern of the gate electrode GL1. Similarly, the opening PCON is provided in an area including an end of the pattern of the connecting electrode ZTCO. In other words, the opening PCON is provided in an area overlapping the patterns of both the gate electrode GL1 and the connecting electrode ZTCO, an area overlapping only the pattern of the area or overlapping only the pattern of the connecting electrode ZTCO, and an area that does not overlap any pattern of the gate electrode GL1 and the connecting electrode ZTCO. The opening PCON is provided for each pixel. Specifically, the opening PCON is provided in an area overlapping the pixel electrode PTCO1. The pixel electrode PTCO1 overlaps a portion of the gate electrode GL1, a portion of the oxide semiconductor layer OS, and the connection electrode ZTCO between the wiring W1-1 and the wiring W1-2. Therefore, the pixel electrode PTCO1 is in contact with the connecting electrode ZTCO in the opening PCON (a second contact area CON2).

The pixel electrode PTCO1 extends in a translucent area as described below. In other words, the pixel electrode PTCO1 is formed in a long shape extending in the direction D2 similar to the oxide semiconductor layer OS and the wiring W1-1 (the first wiring). In the direction D1, a width of the pixel electrode PTCO1 is larger than the width of the oxide semiconductor layer OS at a part where the opening PCON is provided.

As shown in FIG. 11, the connecting electrode ZTCO is formed in a long shape extending along the wiring W1-1. In the direction D1, a width of the opening PCON constituting the second contact area CON2 is larger than the width of the connecting electrode ZTCO. The connecting electrode ZTCO entirely overlaps the pixel electrode PTCO1 in a plan view.

As shown in FIG. 11, the pixel electrodes PTCO1 are aligned in the direction D2. Of the pixels adjacent to the direction D2, one pixel may be referred to as a "first pixel", and the other pixel may be referred to as a "second pixel". For example, the first pixel is a pixel corresponding to the upper pixel electrode PTCO1 among the pixel electrodes PTCO1 aligned in the direction D2 in FIG. 11, and the second pixel is a pixel corresponding to the lower pixel electrode PTCO1 among the pixel electrodes PTCO1 aligned in the direction D2 in FIG. 11. In this case, the first pixel and the second pixel are supplied with a pixel signal from the wiring W1-1.

The pixel electrodes PTCO1 are aligned in the direction D1. A pixel adjacent in the direction D1 with respect to the above first pixel is referred to as a "third pixel", and a pixel adjacent in the direction D1 with respect to the second pixel is referred to as a "fourth pixel". The third pixel and the fourth pixel are adjacent to each other in the direction D2. The third pixel and the fourth pixel are supplied with the pixel signal from the wiring W1-2 (the second wiring) adjacent to the wiring W1-1.

As described above, each of the first pixel, the second pixel, the third pixel, and the fourth pixel includes the transistor Tr1 (pixel transistor), the connecting electrode ZTCO, and the pixel electrode PTCO1.

The transistor Tr1 includes the oxide semiconductor layer OS, the gate electrode GL1 facing the oxide semiconductor layer OS, and the gate insulating layer GI1 between the oxide semiconductor layer OS and the gate electrode GL1. The connecting electrode ZTCO overlaps the gate electrode GL1 and the oxide semiconductor layer OS and contacts the oxide semiconductor layer OS in the opening ZCON (the first contact area CON1) not overlapped with the gate electrode GL1 in a plan view. The pixel electrode PTCO1 overlaps the gate electrode GL1, the oxide semiconductor layer OS, and the connecting electrode ZTCO and is connected to the connecting electrode ZTCO in the opening PCON overlapping the gate electrode GL1 (the second contact area CON2) in a plan view.

The pixel electrode PTCO1 of the first pixel provided on the upper side in FIG. 11 overlaps the oxide semiconductor layer OS of the first pixel and the oxide semiconductor layer OS of the second pixel provided on the lower side of the first pixel in a plan view. The pixel electrode PTCO1 of the first pixel also overlaps a part of the oxide semiconductor layer OS of the fourth pixel in a plan view.

Figure 12:
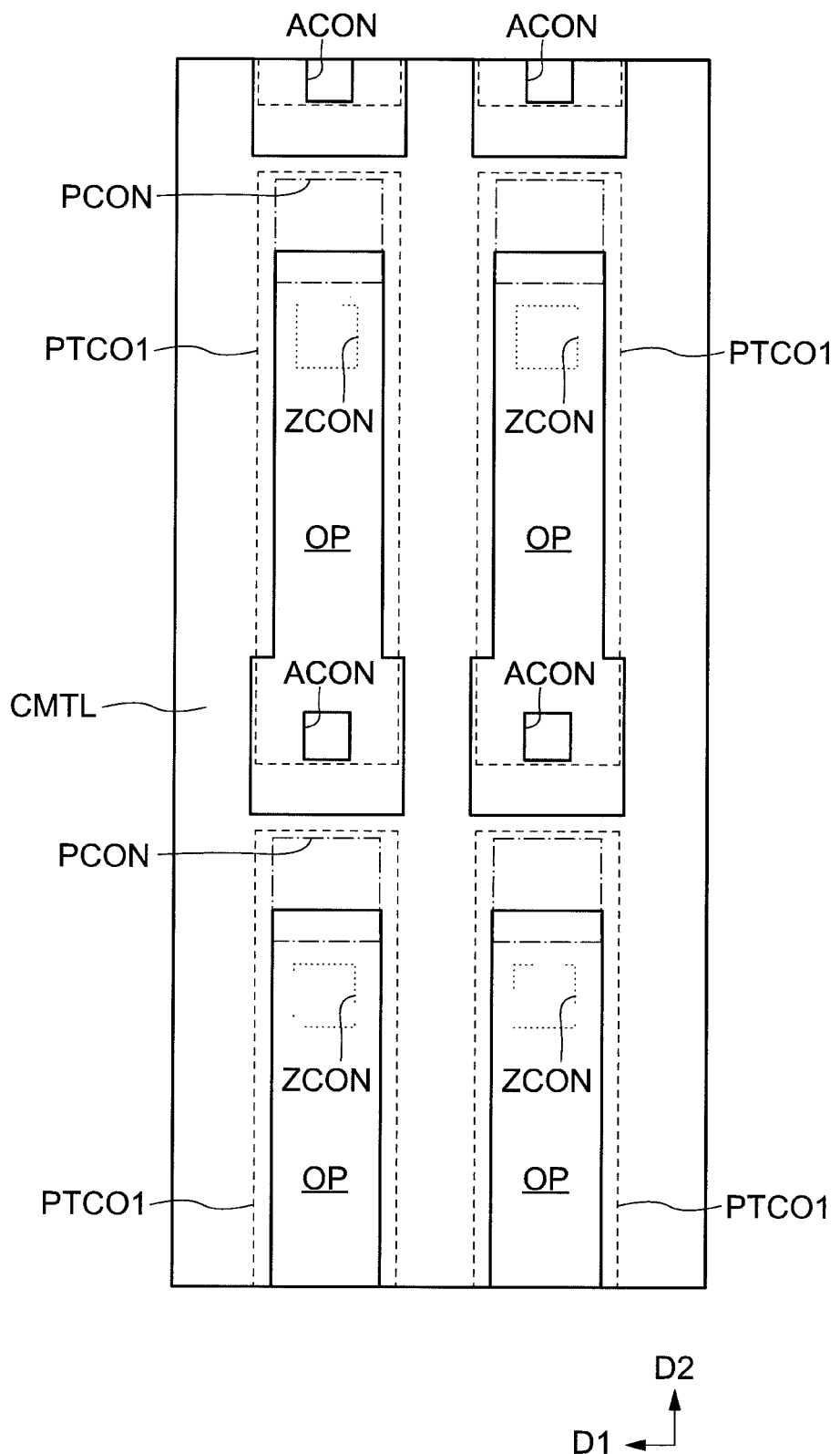
FIG. 12 is a plan view illustrating a layout of one or more layers in a display device according to an embodiment of the present invention.

As shown in FIG. 12, the common auxiliary electrode CMTL is provided in a grid shape so as to surround the periphery of the pixel area. That is, the common auxiliary electrode CMTL is provided in common for a plurality of pixels, and is provided so as to define the respective areas of the plurality of pixels. In other words, the common auxiliary electrode CMTL has an opening OP corresponding to each pixel (translucent area). The opening OP is provided so as to expose the pixel electrode PTCO1. An opening ACON is provided in the vicinity of the lower end of the opening OP of the common auxiliary electrode CMTL. The area in which the opening OP is provided corresponds to a display area. That is, the opening ZCON (the first contact area CON1) and the opening ACON (the third contact area CON3) are included in the opening area. The opening area means an area that contributes to the image display by transmitting light from below the substrate SUB (e.g., backlight). On the other hand, an area that is shielded from light by, for example, a metal layer and does not transmit the light is not included in the opening area. The opening area mentioned above may be referred to as a "light transmitting area".

Figure 13:
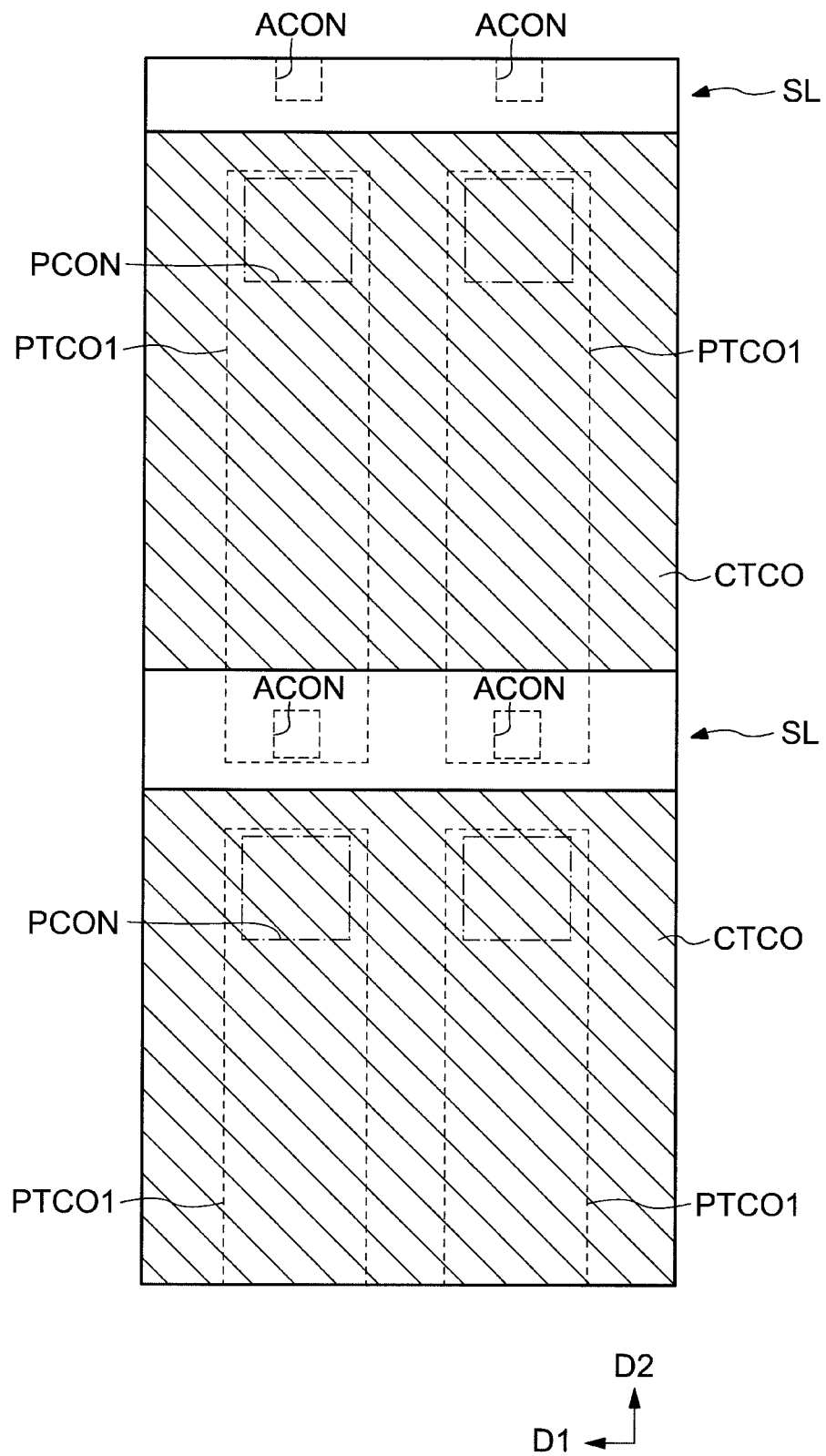
FIG. 13 is a plan view illustrating a layout of one or more layers in a display device according to an embodiment of the present invention.

As shown in FIG. 13, the common electrode CTCO is provided in common for a plurality of pixels. In the present embodiment, the common electrode CTCO is provided in common to the pixels (or the pixel electrode PTCO1) arranged in the direction D1. In other words, the common electrode CTCO has a longitudinal length in the direction D1, and the common electrode CTCO is arranged in the direction D2. A slit SL is provided between the common electrodes CTCO adjacent to each other in the direction D2. In a plan view, the slit SL and the opening ACON overlap. In other words, in a plan view, the pixel electrode PTCO1 exposed from the insulating layers PIL1 and PIL2 at the opening ACON is also exposed from the common electrode CTCO. Referring to FIGS. 12 and 13, the pixel electrode PTCO1 and the common electrode CTCO overlap each other in an area that does not overlap the common auxiliary electrode CMTL in a plan view. The common electrode CTCO separated vertically by the slit SL (see FIG. 13) is electrically connected by the common auxiliary electrode CMTL provided in a grid shape (see FIG. 12).

Figure 14:
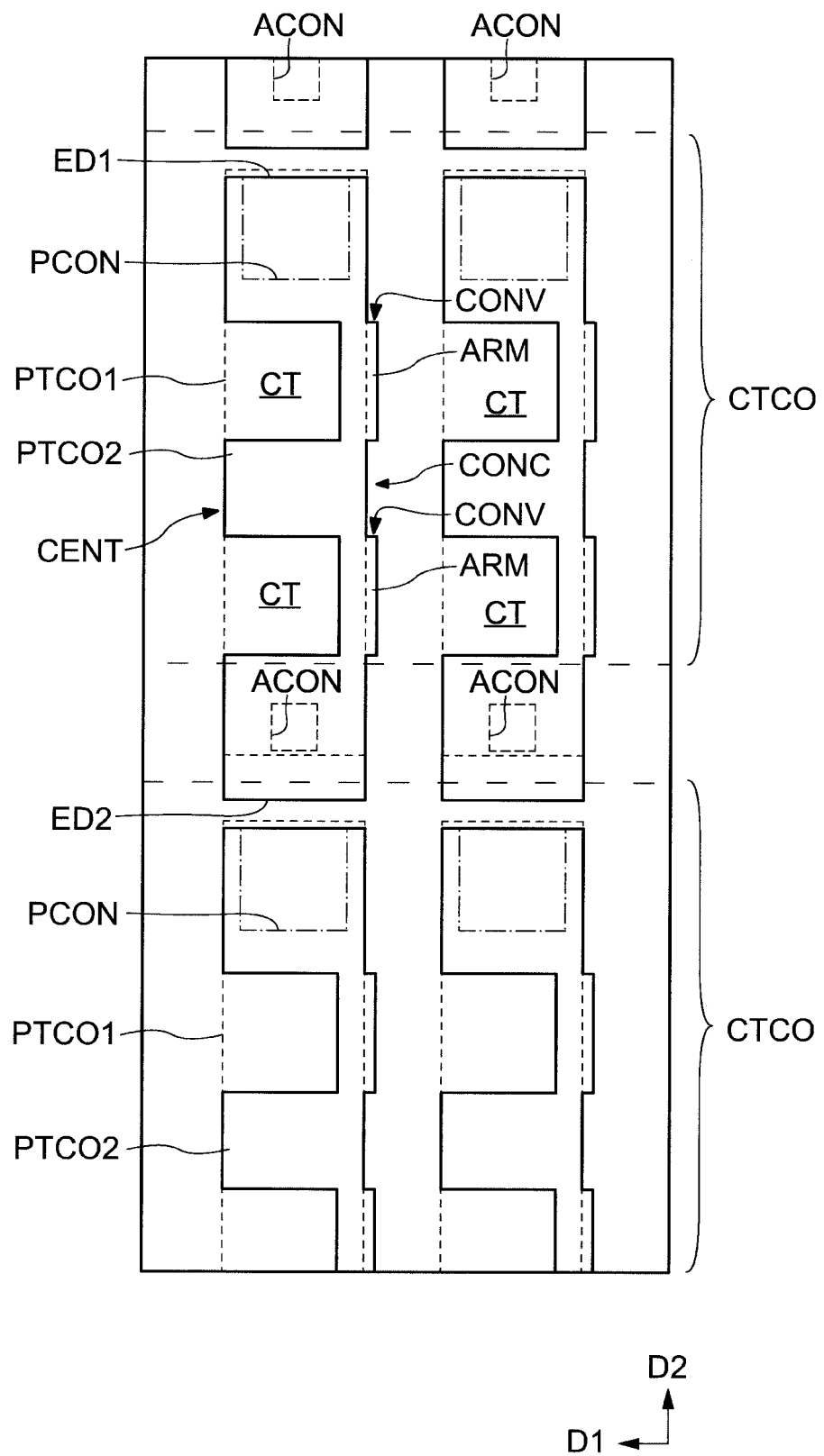
FIG. 14 is a plan view illustrating a layout of one or more layers in a display device according to an embodiment of the present invention.

As shown in FIG. 14, the pixel electrode PTCO2 is provided for each pixel. That is, the pixel electrode PTCO1 and the pixel electrode PTCO2 are provided in pairs. The pixel electrode PTCO2 overlaps the opening PCON and the opening ACON in a plan view. That is, the pixel electrode PTCO2 faces the common electrode CTCO in an area overlapping the opening PCON in a plan view, and is in contact with the pixel electrode PTCO1 in an area overlapping the opening ACON in a plan view.

Referring to FIGS. 12 and 14, in an area that does not overlap the common auxiliary electrode CMTL in a plan view, the pixel electrode PTCO2 and the common electrode CTCO overlap. One or more notches CT provided in the pixel electrode PTCO2, from the side of a first side ED1 extending in the D2 direction toward the side of a second side ED2 opposite to the first side ED1.

In the present embodiment, two notches CT are provided in the pixel electrodes PTCO2 along the direction D2. By this configuration, the pixel electrode PTCO2 has a shape whereby a rectangular portion provided in the side of the first side ED1 and a rectangular portion provided in the side of the second side ED2 are connected to the central portion CENT by the arm ARM. In other words, the arm ARM is provided in a position corresponding to the notch CT. In other words, in the D1 direction, the arm ARM protrudes slightly toward the side opposite to the side where the notch CT is formed (the opposite direction of the D1 direction).

With respect to the above point, when viewing two pixel electrode PTCO2 adjacent in the D1 direction, the arm ARM is provided with a convex portion CONV slightly protruding toward the notch CT of the pixel electrode PTCO2 adjacent to the arm ARM. The convex portion CONV overlaps the common auxiliary electrode CMTL in a plan view. The convex CONV may be referred to as a bridge. A pair of convex portions CONV adjacent in the direction D2 may be referred to as a pair of bridges. A concave CONC formed by the pair of bridges (a pair of the convex portions CONV) faces the central portion CENT of the pixel electrode PTCO2 adjacent to the pixel electrode PTCO2. According to the above configuration, a lateral electric field is formed above the pixel electrode PTCO2 along the edge of the notch CT. As described above, since the convex portion and the concave portion of the bridge are formed, the response speed of liquid crystal molecules is improved.

[1-5. Materials of Each Member of Display Device 10]

A rigid substrate having light transmittance and no flexibility, such as a glass substrate, a silica substrate, and a sapphire substrate can be used as the substrate SUB. On the other hand, in the case where the substrate SUB needs to have a flexibility, a flexible substrate containing a resin and having flexibility, such as a polyimide substrate, an acrylic substrate, a siloxane substrate, or a fluororesin substrate can be used as the substrate SUB. In order to improve the heat resistance of the substrate SUB, impurities may be introduced into the above resin.

General metal materials can be used as the gate electrodes GL1, GL2, the wirings W1, W2, the light-shielding layer LS, and the common auxiliary electrode CMTL. For example, aluminum (Al), titanium (Ti), chromium (Cr), cobalt (Co), nickel (Ni), molybdenum (Mo), hafnium (Hf), tantalum (Ta), tungsten (W), bismuth (Bi), and silver (Ag), or alloys or compounds thereof are used as members of these electrodes and the like. The above materials may be used in a single layer or a stacked layer as the members of the above electrodes and the like.

For example, a stacked structure of Ti/Al/Ti is used as the gate electrode GL1. In the present embodiment, the cross-sectional shape of a pattern end of the gate electrode GL1 having the above stacked structure is a forward taper shape.

General insulating materials can be used as the gate insulating layers GI1, GI2, and the insulating layers IL1 to IL5 and PIL1 to PIL2. For example, inorganic insulating layers such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), and the like can be used as the insulating layers IL1 to IL3, IL5 and PIL1 to PIL2. Low-defect insulating layers can be used as these insulating layers.

The above $SiO_xN_y$ and $AlO_xN_y$ are silicone compounds and aluminum compounds containing nitrogen (N) in a smaller ratio (x>y) than oxygen (O). The above $SiN_xO_y$ and $AlN_xO_y$ are silicon compounds and aluminum compounds containing oxygen in a smaller ratio (x>y) than nitrogen.

Organic insulating materials such as a polyimide resin, an acrylic resin, an epoxy resin, a silicone resin, a fluororesin, or a siloxane resin can be used as the insulating layer IL4. The above organic insulating materials may be used as the gate insulating layers GI1, GI2, and the insulating layers IL1 to IL3, IL5. The above materials may be used in a single layer or a stacked layer as a member of the insulating layer and the like.

$SiO_x$ with a thickness of 100 nm is used as the gate insulating layer GI1 as an example of the above insulating layer. $SiO_x/SiN_x/SiO_x$ with a total thickness of 600 nm to 700 nm is used as the insulating layer IL1. $SiO_x/SiN_x$ with a total thickness of 60 nm to 100 nm is used as the gate insulating layer GI2. $SiO_x/SiN_x/SiO_x$ with a total thickness of 300 nm to 500 nm is used as the insulating layer IL2. $SiO_x$ with a total thickness of 200 nm to 500 nm (single layer), $SiN_x$ (single layer), or a stacked layer thereof is used as the insulating layer IL3. The organic layer with a thickness of 2

μm to 4 μm is used as the insulating layer IL4. $SiN_x$ (single layer) with a thickness of 50 nm to 150 nm is used as the insulating layer IL5.

A metal oxide having semiconductor characteristics can be used as the oxide semiconductor layer OS. The oxide semiconductor layer OS has light transmittance. For example, an oxide semiconductor containing indium (In), gallium (Ga), zinc (Zn), and oxygen (O) can be used as the oxide semiconductor layer OS. In particular, an oxide semiconductor having a composition ratio of In:Ga:Zn:O=1:1:1:4 can be used. However, the oxide semiconductor containing In, Ga, Zn, and O used in the present embodiment is not limited to the above composition, and an oxide semiconductor having a composition different from that described above can also be used. For example, the ratio of In may be larger than that described above to improve mobility. The ratio of Ga may be larger to increase the band gap and reduce the influence of light irradiation.

Other elements may be added to the oxide semiconductor containing In, Ga, Zn, and O. For example, a metal element such as Al or Sn may be added to the oxide semiconductor. In addition to the oxide semiconductor described above, an oxide semiconductor containing In and Ga (IGO), an oxide semiconductor containing In and Zn (IZO), an oxide semiconductor containing In, Sn, and Zn (ITZO), and an oxide semiconductor containing In and W may be used as the oxide semiconductor layer OS. The oxide semiconductor layer OS may be amorphous or crystalline. The oxide semiconductor layer OS may be a mixed phase of amorphous and crystalline.

A transparent conductive layer is used as the connecting electrode ZTCO, the pixel electrode PTCO1, PTCO2, and the common electrode CTCO. A mixture of indium oxide and tin oxide (ITO) and a mixture of indium oxide and zinc oxide (IZO) can be used as the transparent conductive layer. Materials other than the above may be used as the transparent conductive layer.

As described above, according to the display device 10 of the present embodiment, the storage capacitive elements (the first capacitive element CAP1 and the second capacitive element CAP2) of the pixel circuits can be stacked above the selection transistor (the transistor Tr1). As a result, the capacitive element having a larger capacitance can be formed in a relatively small area. Therefore, even if the pixel size of a display device is reduced, it is possible to realize a stable display operation.

Further, conduction between the oxide semiconductor layer OS and the connecting electrode ZTCO can be ensured by directly contacting the oxide semiconductor layer OS and the connecting electrode ZTCO in the transistor Tr1. Therefore, there is no need to provide a metal layer between the oxide semiconductor layer OS and the connecting electrode ZTCO. With this configuration, since light is not blocked in the opening ZCON (the first contact area CON1), it is possible to suppress a decrease in the opening ratio even if the opening ZCON is provided in the display area. The oxide semiconductor layer has light transmittance. Therefore, in the present embodiment, although the oxide semiconductor layer is provided in an opening area of the pixel area, light incident from the backlight to the substrate SUB passes through the oxide semiconductor layer. Therefore, the reduction in the light transmittance in the opening area due to the oxide semiconductor layer provided in the opening area is reduced as much as possible. Since the oxide semiconductor layer OS has light transmittance, it is less likely to cause unevenness in transmitted light, unlike the silicon layer.

Since the oxide semiconductor layer OS is provided in the display area, it is possible to suppress the occurrence of display unevenness.

2. Second Embodiment

An entire configuration of the display device described in the first embodiment and the second embodiment will be described with reference to FIG. 15 to FIG. 17.

[2-1. Outline of Display Device 200]

Figure 15:
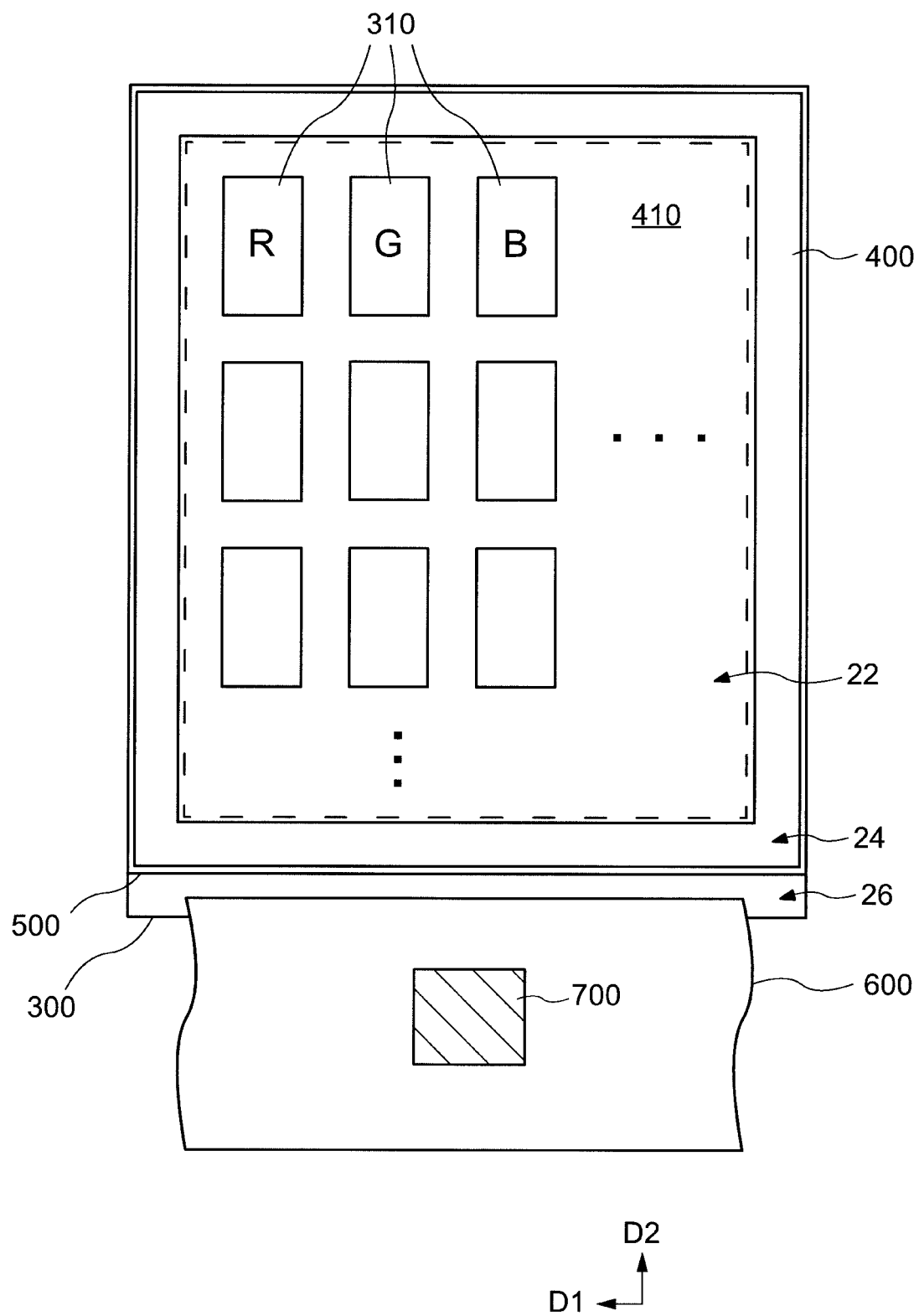
FIG. 15 is a plan view showing an outline of a display device according to an embodiment of the present invention.

FIG. 15 is a plan view showing an outline of a display device according to an embodiment of the present invention. As shown in FIG. 15, a display device 20 includes an array substrate 300, a seal part 400, a counter substrate 500, a flexible printed circuit board 600 (FPC 600), and an IC chip 700. The array substrate 300 and the counter substrate 500 are bonded by the seal part 400. Multiple pixel circuits 310 are arranged in a matrix in a display area 22 surrounded by the seal part 400. Among the display area 22, a part in which a plurality of pixel circuits is provided and which contributes to display an image is the display area. The liquid crystal area 22 is an area overlapping a liquid crystal element 410 described later in a plan view. An area surrounding the display area are referred to as a peripheral area. The transistor Tr1 (first transistor) is provided in the liquid crystal area 22 (display area).

The display device 20 includes a seal area 24 provided with a seal portion 400 in a peripheral area. The display area 22 is surrounded by the seal area 24. The FPC 600 is provided in the terminal area 26 which is a part of the peripheral area. A terminal area 26 is formed in an area of the array substrate 300 that does not overlap the opposing substrate 500. The IC chip 700 is provided on a FPC 600. The IC chip 700 provides a signal for driving each pixel circuit 310. The seal area 24 or an area obtained by combining the seal area 24 and the terminal area 26 are areas surrounding the display area 22. These areas may be referred to as "frame areas". The transistor Tr2 (the second transistor) is provided in the frame area.

[Circuit Configuration of Display Device 20]

Figure 16:
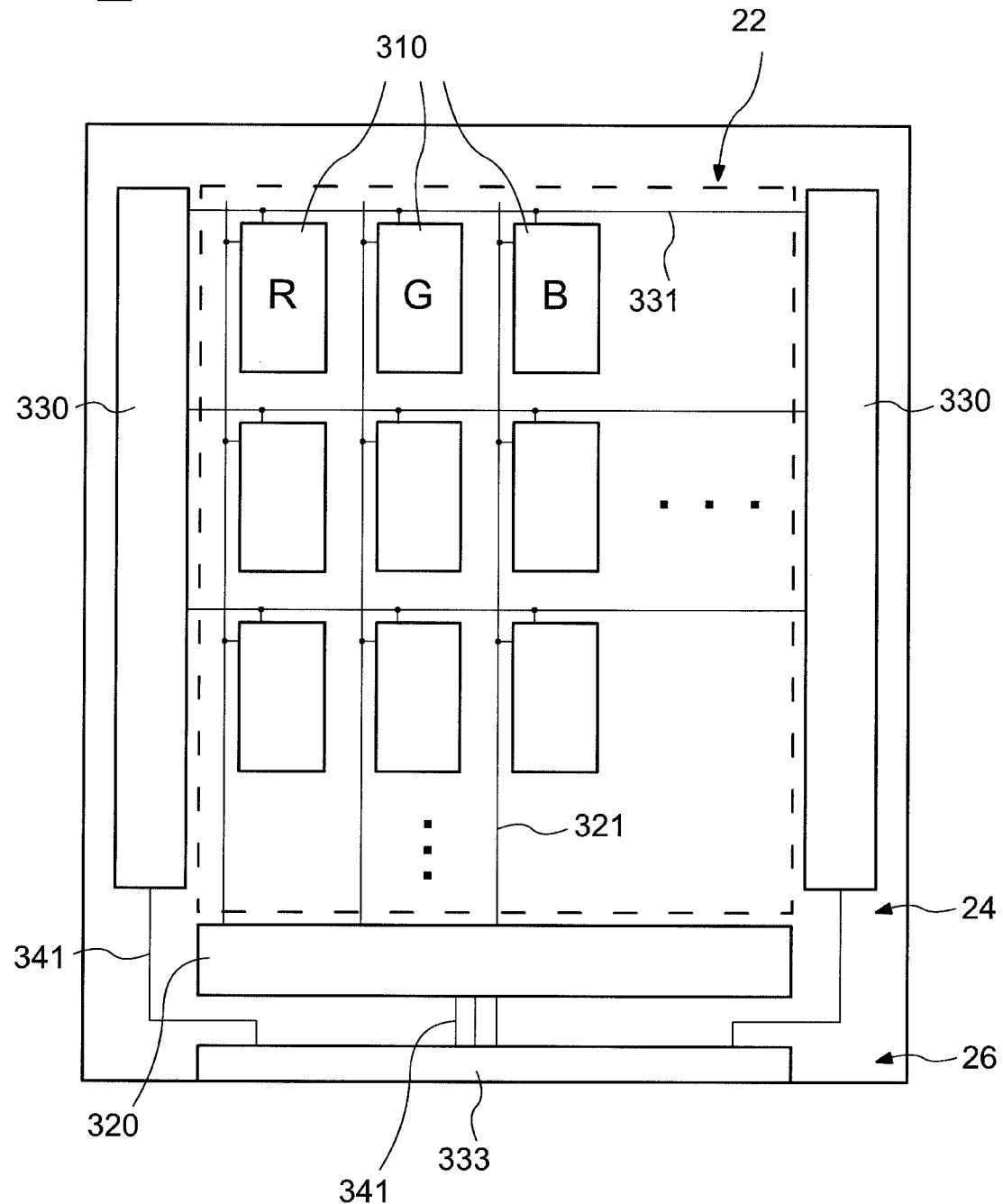
FIG. 16 is a block diagram showing a circuit configuration of a display device according to an embodiment of the present invention.

FIG. 16 is a block diagram showing a circuit configuration of a display device according to an embodiment of the present invention. As shown in FIG. 16, a source driver circuit 320 is provided in a position which is the peripheral area and adjacent to the display area 22 in which the pixel circuit 310 is provided in the direction D2 (row direction). A gate driver circuit 330 is provided in a position which is the peripheral area and adjacent to the display area 22 in the direction D1 (column direction). The source driver circuit 320 and the gate driver circuit 330 are provided in the seal area 24 described above. However, the area where the source driver circuit 320 and the gate driver circuit 330 are provided is not limited to the seal area 24, and it may be any area as long as it is the outside the area (the peripheral area) provided with the pixel circuit 310.

A source wiring 321 extends in the direction D2 from the source driver circuit 320 and is connected to the multiple pixel circuits 310 arranged in the direction D2. A gate wiring 331 extends in the direction D1 from the gate driver circuit 330 and is connected to the multiple pixel circuits 310 arranged in the direction D1.

The terminal area 26 is provided with a terminal part 333. The terminal part 333 and the source driver circuit 320 are connected by a connecting wiring 341. Similarly, the terminal part 333 and the gate driver circuit 330 are connected by the connecting wiring 341. When the FPC 600 is connected to the terminal part 333, an external device to which the FPC 600 is connected and the display device 20 are connected, and each pixel circuit 310 provided in the display device 20 is driven by a signal from the external device.

The transistor Tr1 shown in the first embodiment is used for the pixel circuit 310. The transistor Tr2 shown in the first embodiment is used to the transistor included in the source driver circuit 320 and the gate driver circuit 330.

[Pixel Circuit 310 of Display Device 20]

Figure 17:
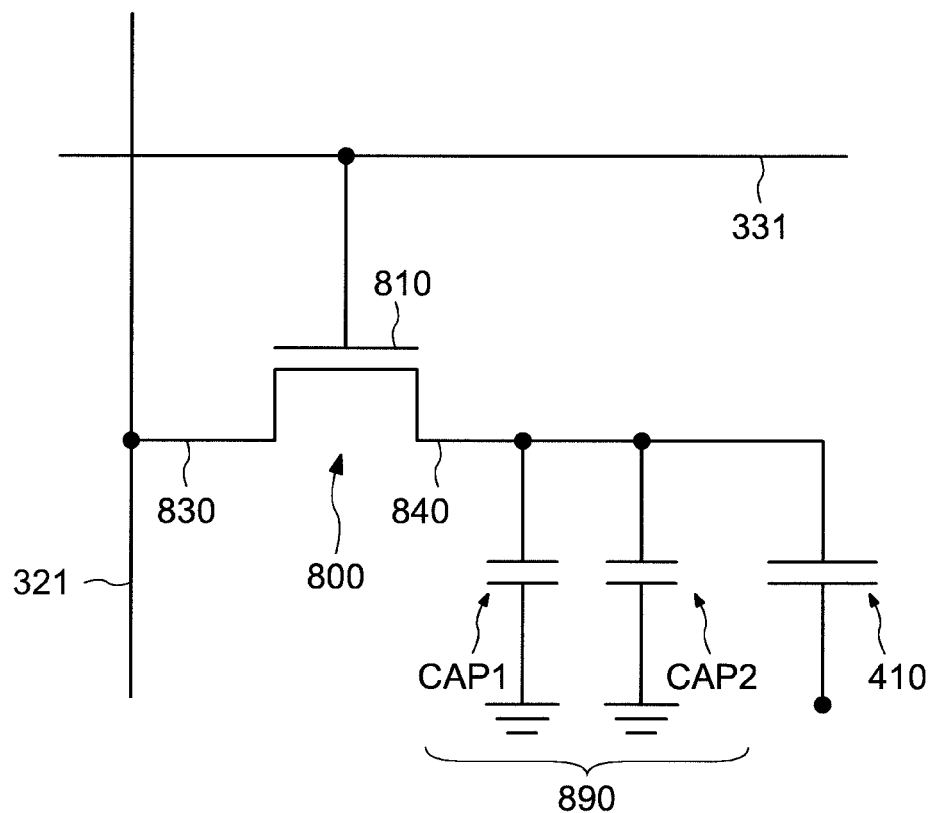
FIG. 17 is a circuit diagram showing a pixel circuit of a display device according to an embodiment of the present invention.

FIG. 17 is a circuit diagram showing a pixel circuit of a display device according to an embodiment of the present disclosure. As shown in FIG. 17, the pixel circuit 310 includes elements such as a transistor 800, a holding capacitor 890, and a liquid crystal element 410. The storage capacitor 890 includes a first capacitive element CAP1 and a second capacitive element CAP2. An electrode of the transistor 800 side of the first capacitive element CAP1 is a pixel electrode PTCO1. An electrode of the transistor 800 side of the second capacitive element CAP2 is a pixel electrode PTCO2. GND potential side electrodes of the first capacitive element CAP1 and the second capacitive element CAP2 are common electrodes CTCO.

One electrode (the transistor 800 side) of the liquid crystal element 410 is the pixel electrode PTCO2 and the other electrode is the common electrode CTCO. The transistor 800 includes a first gate electrode 810, a first source electrode 830, and a first drain electrode 840. The first gate electrode 810 is connected to the gate wiring 331. The first source electrode 830 is connected to the source wiring 321. The first drain electrode 840 is connected to the storage capacitor 890 and the liquid crystal element 410. The transistor Tr1 shown in the first embodiment is applied to the transistor 800 shown in FIG. 17. In the present embodiment, for convenience of explanation, although 830 is referred to as a source electrode and 840 is referred to as a drain electrode, the function of each electrode as a source and a drain may be replaced.

Each of the embodiments described above as an embodiment of the present invention can be appropriately combined and implemented as long as they do not contradict each other. Further, the addition, deletion, or design change of components as appropriate by those skilled in the art based on each embodiment are also included in the scope of the present invention as long as they are provided with the gist of the present invention.

It is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising:
    a first transistor provided with an oxide semiconductor layer, a first gate electrode facing the oxide semiconductor layer and a first gate insulating layer between the oxide semiconductor layer and the first gate electrode;
    a first transparent conductive layer above the first transistor;
    a second transparent conductive layer above the first transparent conductive layer, the second transparent conductive layer being isolated from the first transparent conductive layer, a main surface of the second transparent conductive layer overlapping the first transparent conductive layer in a plan view;
    a third transparent conductive layer above the second transparent conductive layer, the third transparent conductive layer being isolated from the second transparent conductive layer, being connected to the first transparent conductive layer and facing the second transparent conductive layer; and
    a light-shielding layer provided above the first transistor so as to define each of a plurality of pixels,
    wherein the first transparent conductive layer and the second transparent conductive layer overlap and the second transparent conductive layer and the third transparent conductive layer overlap in an area not overlapping the light-shielding layer in a plan view.

2. The display device according to claim 1, wherein the first transparent conductive layer is connected to the first transistor.

3. The display device according to claim 2, wherein the second transparent conductive layer is provided in common to a plurality of pixels.

4. The display device according to claim 3, further comprising a fourth transparent conductive layer including a first portion and a second portion,
    wherein
    the first portion overlaps the first gate electrode and the oxide semiconductor in a plan view,
    the second portion is in contact with the oxide semiconductor layer in a first contact area,
    the first contact area does not overlap the first gate electrode in a plan view, and
    the first transparent conductive layer is in contact with the fourth transparent conductive layer in a second contact area overlapping the first gate electrode in a plan view.

5. The display device according to claim 1, wherein the third transparent conductive layer is in contact with the first transparent conductive layer in a third contact area not overlapping the light-shielding layer in a plan view.

6. The display device according to claim 1, further comprising:
    a first dielectric body between the first transparent conductive layer and the second transparent conductive layer; and
    a second dielectric body between the second transparent conductive layer and the third transparent conductive layer.

7. A display device comprising:
    a first transistor provided with an oxide semiconductor layer, a first gate electrode facing the oxide semiconductor layer and a first gate insulating layer between the oxide semiconductor layer and the first gate electrode;
    a first transparent conductive layer above the first transistor;
    a second transparent conductive layer above the first transparent conductive layer, the second transparent conductive layer being isolated from the first transparent conductive layer, a main surface of the second transparent conductive layer overlapping the first transparent conductive layer in a translucent area of a pixel in a plan view;
    a third transparent conductive layer above the second transparent conductive layer, the third transparent conductive layer being isolated from the second transparent conductive layer, being connected to the first transparent conductive layer and overlapping the second transparent conductive layer in the translucent area; and
    a light-shielding layer above the first transistor, the light-shielding layer being provided in common to a plurality of pixels and having an opening corresponding to the translucent area,
    wherein the first transparent conductive layer and the second transparent conductive layer overlap and the second transparent conductive layer and the third transparent conductive layer overlap in the translucent area.

8. The display device according to claim 7, wherein the first transparent conductive layer is connected to the first transistor.

9. The display device according to claim 8, wherein the second transparent conductive layer is provided in common to the plurality of pixels.

10. The display device according to claim 9, further comprising a fourth transparent conductive layer including a first portion and a second portion,
wherein
the first portion overlaps the first gate electrode and the oxide semiconductor in a plan view,
the second portion is in contact with the oxide semiconductor layer in a first contact area,
the first contact area does not overlap the first gate electrode in a plan view, and
the first transparent conductive layer is in contact with the fourth transparent conductive layer in the translucent area.

11. The display device according to claim 7, wherein the third transparent conductive layer is in contact with the first transparent conductive layer in a third contact area included in the translucent area.

12. The display device according to claim 7, further comprising:
a first dielectric body between the first transparent conductive layer and the second transparent conductive layer; and
a second dielectric body between the second transparent conductive layer and the third transparent conductive layer.

13. The display device according to claim 1, further comprising:
a second transistor including a semiconductor layer, a second gate electrode facing the semiconductor layer and a second gate insulating layer between the semiconductor layer and the second gate electrode; and
a first insulating layer above the semiconductor layer,
wherein the first insulating layer is continuous without passing an interface with the first gate insulating layer.

14. The display device according to claim 13, wherein
the first transistor is included in a pixel circuit provided in a pixel, and
the second transistor is included in a driver circuit configured to drive the pixel circuit.

15. The display device according to claim 7, further comprising:
a second transistor including a semiconductor layer, a second gate electrode facing the semiconductor layer and a second gate insulating layer between the semiconductor layer and the second gate electrode; and
a first insulating layer above the semiconductor layer,
wherein the first insulating layer is continuous without passing an interface with the first gate insulating layer.

16. The display device according to claim 15, wherein
the first transistor is included in a pixel circuit provided in a pixel, and
the second transistor is included in a driver circuit configured to drive the pixel circuit.

17. A display device comprising:
a first transistor provided with an oxide semiconductor layer, a first gate electrode facing the oxide semiconductor layer and a first gate insulating layer between the oxide semiconductor layer and the first gate electrode;
a first transparent conductive layer above the first transistor;
a second transparent conductive layer above the first transparent conductive layer, the second transparent conductive layer being isolated from the first transparent conductive layer, a main surface of the second transparent conductive layer overlapping the first transparent conductive layer in a plan view;
a third transparent conductive layer above the second transparent conductive layer, the third transparent conductive layer being isolated from the second transparent conductive layer, being connected to the first transparent conductive layer and facing the second transparent conductive layer;
a first dielectric body between the first transparent conductive layer and the second transparent conductive layer; and
a second dielectric body between the second transparent conductive layer and the third transparent conductive layer.

* * * * *